United States Patent
Yamazaki et al.

(10) Patent No.: US 6,768,354 B2
(45) Date of Patent: Jul. 27, 2004

(54) MULTI-POWER SEMICONDUCTOR INTEGRATED CIRCUIT DEVICE

(75) Inventors: Akira Yamazaki, Hyogo (JP); Fukashi Morishita, Hyogo (JP); Yasuhiko Taito, Hyogo (JP); Nobuyuki Fujii, Hyogo (JP); Mihoko Akiyama, Hyogo (JP); Mako Kobayashi, Hyogo (JP)

(73) Assignees: Renesas Technology Corp., Tokyo (JP); Mitsubishi Electric Engineering Company Limited, Tokyo (JP)

(*) Notice: Subject to any disclaimer, the term of this patent is extended or adjusted under 35 U.S.C. 154(b) by 0 days.

(21) Appl. No.: 09/780,477

(22) Filed: Feb. 12, 2001

(65) Prior Publication Data
US 2002/0011883 A1 Jan. 31, 2002

(30) Foreign Application Priority Data
Jul. 26, 2000 (JP) ........................................ 2000-225228

(51) Int. Cl.⁷ .............................................. H03L 7/00
(52) U.S. Cl. ........................................ 327/143; 365/226
(58) Field of Search .................................. 327/143, 198; 365/226, 227

(56) References Cited

U.S. PATENT DOCUMENTS

| | | | | |
|---|---|---|---|---|
| 5,369,310 A | * | 11/1994 | Badyal et al. | 327/143 |
| 5,457,421 A | * | 10/1995 | Tanabe | 327/530 |
| 5,469,099 A | | 11/1995 | Konishi | 327/198 |
| 5,936,443 A | * | 8/1999 | Yasuda et al. | 327/143 |
| 6,160,431 A | * | 12/2000 | Crotty | 327/143 |
| 6,252,442 B1 | * | 6/2001 | Malherbe | 327/143 |

FOREIGN PATENT DOCUMENTS

JP   09-098083   8/1997

* cited by examiner

*Primary Examiner*—Terry D. Cunningham
*Assistant Examiner*—Quan Tra
(74) *Attorney, Agent, or Firm*—McDermott Will & Emery LLP

(57) ABSTRACT

With power-on detection circuits provided for a plurality of power supply voltages, a main power-on detection signal is maintained at the active state to reset an internal node while at least one of the power-on detection signals is active. In a multi-power semiconductor integrated circuit device, current consumption at the time of power-up is reduced.

24 Claims, 12 Drawing Sheets

MULTI-POWER SEMICONDUCTOR INTEGRATED CIRCUIT DEVICE

BACKGROUND OF THE INVENTION

1. Field of the Invention

The present invention relates to a multi-power semiconductor integrated circuit device and, more particularly, to a multi-power semiconductor integrated circuit device in which a logic circuit and a memory are integrated on the same semiconductor chip. More specifically, the present invention relates to a power supply structure of a system LSI in which a logic such as a processor and a DRAM (Dynamic Random Access Memory) are integrated on the same semiconductor chip.

2. Description of the Background Art

FIG. 16 is a diagram schematically showing a structure of a conventional general-purpose DRAM (Dynamic Random Access Memory). In FIG. 16, the conventional DRAM includes a memory cell array MA having memory cells arranged in matrix of rows and columns, sense amplifiers SA for sensing, amplifying and latching data of memory cells connected to a selected row of the memory cell array MA, a row decoder RD for selecting an addressed row of the memory cell array MA, a control circuit CTL for controlling internal operation of the DRAM, and an internal voltage generation circuit IVG receiving an external power supply voltage VDDH for generating internal (power supply) voltages VDDS, VPP and VDDP therefrom.

The internal voltage VDDS is applied to the sense amplifiers SA as an operation power supply voltage. By the power supply voltage for sense amplifiers (array power supply voltage) VDDS, a logical high or "H" level voltage level of storage data of a memory cell in the memory cell array MA is determined.

The internal voltage VPP is transmitted to a word line arranged corresponding to a selected row of the memory cell array MA through the row decoder RD. The voltage VPP is generated by boosting the external power supply voltage VDDH.

The internal voltage VDDP is applied to the control circuit CTL as an operation power supply voltage. The power supply voltages VDDS and VDDP are generated by down-converting the external power supply voltage VDDH.

General-purpose DRAM in general receives the single power supply voltage VDDH for an supplied external power supply and generates an internal voltage of a necessary voltage level internally to operate. In general, the voltage level of the external power supply voltage VDDH is determined by an external factor, a power supply voltage supplied to a system where the DRAM is used. The internal (power supply) voltages VDDS, VDDP and VPP have their voltage levels determined by a gate length following miniaturization of an internal transistor. In miniaturization, a gate length and a gate insulation film are proportionally reduced according to the scaling rule. Therefore, a breakdown voltage is determined by a gate length of a MOS (insulated gate type field effect) transistor and a voltage level of an internal voltage is determined accordingly. For example, when the external power supply voltage VDDH is 3.3 V, the boosted voltage VPP is 3.6 V, the sense amplifier power supply voltage (array power supply voltage) VDDS is 2.0 V, and the power supply voltage for a control circuit in peripheral circuitry (periphery power supply voltage) VDDP is 2.5 V.

In recent years, system LSIs have been widely used in which logic circuits and DRAMs having a large storage capacity are integrated on the same semiconductor substrate. In such system LSIs, transistors more scaled down than transistors in a DRAM part are used for components of a logic circuit part in order to improve performance of the logic circuit and increase an integration degree. Therefore, as a power supply voltage of the logic circuit part, a power supply voltage lower than that of the DRAM part is employed.

FIG. 17 is a diagram schematically showing a power supply structure of such a system LSI. In FIG. 17, the system LSI SLS includes a logic LG and a DRAM macro DM. The DRAM macro DM, similarly to the general-purpose DRAM shown in FIG. 16, includes a memory cell array MA, a row decoder RD, sense amplifiers SA and a control circuit CTL. For the control circuit CTL, a MOS transistor is used, which is the same in size (gate insulation film thickness) as that of a transistor used in the logic LG. In the DRAM macro DM, an internal voltage generation circuit IVGA is provided. The internal voltage generation circuit IVGA generates a sense amplifier power supply voltage VDDS and a word line driving boosted voltage VPP from an external power supply voltage VDDH. To the logic LG, a dedicated power supply voltage VDDL is applied externally. When the logic power supply voltage VDDL is generated by down-converting the external power supply voltage VDDH for DRAM, an ineffective power in a down-converting circuit is increased to increase power consumption. Therefore, the power supply voltage VDDL for the logic LG is applied from an external source. The external power supply voltage VDDL for logic is also applied to the control circuit CTL. Use of the same transistor (transistor having the gate insulation film being the same in thickness and material) as that of the logic LG in the control circuit CTL enables the control circuit CTL to operate at a high speed.

Therefore, for such a system LSI SLS as illustrated in FIG. 17, two power sources, the external power supply voltage VDDH for DRAM and the power supply voltage VDDL for logic, are used.

In row decoder RD as illustrated in FIGS. 16 and 17, a signal of the boosted voltage VPP level needs to be driven according to a signal having an amplitude of the power supply voltage VDDP or VDDL level, and level conversion of the input signal is required for the row decoder RD.

FIG. 18 is a diagram showing one example of a structure of a VDDL/VPP level conversion circuit. In FIG. 18, the VDDL/VPP level conversion circuit includes an inverter IV1 receiving an input signal SigL whose amplitude is at a VDDL level, an inverter IV2 receiving the output signal of the inverter IV1, an N channel MOS transistor NTR1 responsive to the output signal of the inverter IV1 for coupling a node ND1 to a ground node, an N channel MOS transistor NTR2 responsive to the output signal of the inverter IV2 for coupling a node ND2 to the ground node, a P channel MOS transistor PTR1 responsive to the signal of the node ND2 for coupling a boosted voltage node to the node ND1, a P channel MOS transistor PTR2 responsive to the signal on the node ND1 for coupling the boosted node to the node ND2, and an inverter IV3 for inverting the signal on the node ND2 to generate an output signal SigP having an amplitude of a boosted voltage VPP level. The inverters IV1 and IV2 receive a voltage VDDL (or VDDP) as one operation power supply voltage. The inverter IV3 receives a boosted voltage VPP as one operation power supply voltage.

In the level conversion circuit shown in FIG. 18, when the input signal SigL is at a "H" level of the voltage VDDL level, the MOS transistor NTR1 is turned off and the MOS transistor NTR2 is turned on, and the node ND2 is driven to a ground voltage level and the node ND1 is driven to the boosted voltage VPP level. The output signal SigP accordingly attains an H level of the boosted voltage VPP level.

When the input signal SigL is at a logical low or "L" level, the MOS transistor NTR1 is turned on and the MOS transistor NTR2 is turned off, and the node ND1 attains the ground voltage level and the node ND2 attains the boosted voltage VPP level. The output signal SigP accordingly attains a "L" level of the ground voltage level.

In the general-purpose DRAM shown in FIG. 16 with a single external power source only, the internal voltages VDDS, VPP and VDDP are generated according to the external power supply voltage VDDH. Therefore, since at the time of power-on, the boosted voltage VPP is generated following the external power supply voltage VDDH with substantially no delay, there barely arises a period in which a node of the level conversion circuit 32 is driven to an intermediate voltage level.

In a system LSI as illustrated in FIG. 17 having two power sources, however, the power supply voltage VDDL for logic and the power supply voltage VDDH for DRAM are used. The sequence of power-on and a voltage rise time (a time required for entering a settled state) of these power supply voltages VDDL and VDDH are not defined by specifications. Consider, for example, a case where the power supply voltage VDDH is applied first and the power supply voltage VDDL is then applied as shown in FIG. 19. The boosted voltage VPP is generated according to the power supply voltage VDDH for DRAM. Specifically, at time T1, the power supply voltage VDDH is applied and subsequently at time T2 the VDDL is applied. In this case, before time T2, both of the output signals of the inverters IV1 and IV2 are at the "L" level, and therefore, the MOS transistors NTR1 and NTR2 both maintain the off state.

In this case, the nodes ND1 and ND2 are held at an intermediate voltage level, which can not be specified in advance, between the ground voltage GND and the boosted voltage VPP according to the MOS transistors PTR1 and PTR2. The inverter IV3 receives the boosted voltage VPP as one operation power supply voltage. As a result, there arises a problem that when the voltage level of the node ND2 is the intermediate voltage level, a through current flows from the boosted power supply node to the gourd node to increase current consumption at the time of power-on. The boosted voltage VPP is normally generated by a charge-pump circuit utilizing charge-pumping operation of a capacitor.

When the boosted voltage VPP is consumed by such through current, current consumption of the charge-pump circuit for generating the boosted voltage is further increased (efficiency of charge-pump is lower than 1) to increase power consumption. This is also the case with other voltages VDDS and VDDP. In other words, there occurs a problem that at a circuit for converting a signal of the amplitude VDDL into a signal of the amplitude VDDS or VDDP, a through current is generated to increase current consumption.

SUMMARY OF THE INVENITON

An object of the present invention is to provide a semiconductor integrated circuit device having a multi-power structure with a reduced power consumption at the power-on.

A semiconductor integrated circuit device according to the present invention includes a first power-on detection circuit responsive to a first power supply voltage for detecting application of the first power supply voltage to activate a first power-on detection signal according to the detection result, a second power-on detection circuit responsive to a second power supply voltage for detecting application of the second power supply voltage to activate a second power-on detection signal according to the detection result, and a main power-on detection circuit coupled to the first and second power-on detection circuits for generating a main power-on detection signal that is activated while at least one of the first and the second power-on detection signals is at an activate state.

A semiconductor integrated circuit device according to another aspect of the present invention includes an internal voltage generation circuit receiving a first power supply voltage and generating an internal voltage different in voltage level from the first power supply voltage, an internal voltage application detection circuit for activating an internal voltage application detection signal according to a voltage level of the internal voltage, a power-on detection circuit for detecting application of a second power supply voltage to activate a power-on detection signal according to the detection result, and a main power-on detection circuit responsive to the internal voltage application detection signal and the power-on detection signal for generating a main power-on detection signal that is activated while at least one of the internal voltage application detection signal and the power-on detection signal is at the active state.

In a case of a semiconductor integrated circuit device having a plurality of power sources, by individually detecting application of these plurality of power sources and maintaining a main power-on detection signal at the active state while at least one of power-on detection signals is at the active state, an internal circuit can be maintained at a reset state until the plurality of power supply voltages become stable, which enables an internal node to be set at a predetermined state different from an uncertain intermediate voltage level, to suppress a through current.

In addition, by monitoring a voltage level of an internal voltage to maintain the main power-on detection signal at the active state until the internal voltage attains a predetermined voltage level or while an external power supply voltage is unstable, the internal node can be maintained at an initial, reset state until an internally necessary voltage is stabilized, resulting in prevention of the internal node voltage level from going up to an unstable intermediate level to reliably suppress a circuit malfunction and a through current.

The foregoing and other objects, features, aspects and advantages of the present invention will become more apparent from the following detailed description of the present invention when taken in conjunction with the accompanying drawings.

PREFERRED EMBODIMENTS OF THE PRESENT INVENTION

[First Embodiment]

Figure 1:
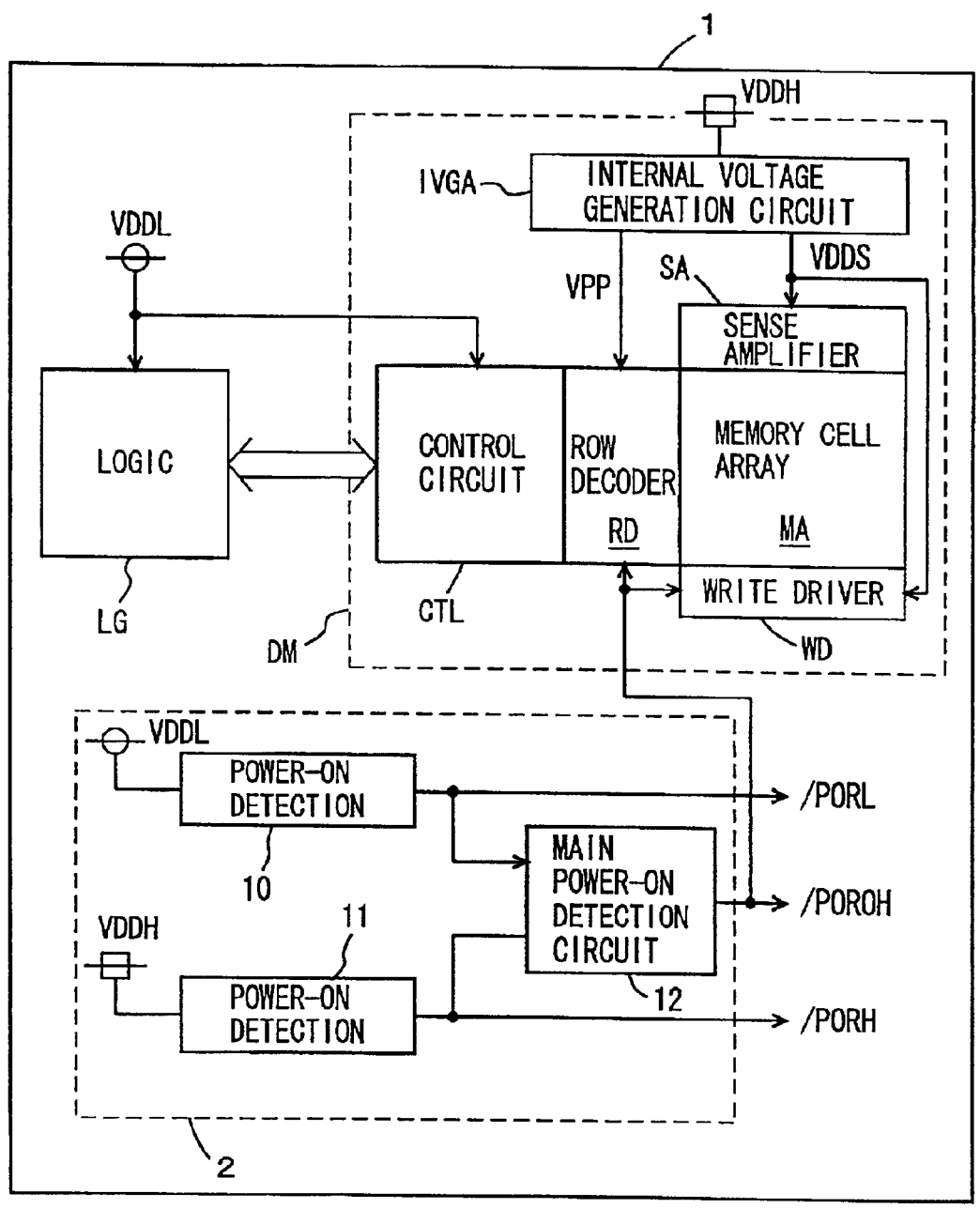
FIG. 1 is a diagram schematically showing an entire structure of a semiconductor integrated circuit device according to the present invention.

FIG. 1 is a diagram schematically showing an entire structure of a semiconductor integrated circuit device according to a first embodiment of the present invention. In FIG. 1, to a semiconductor integrated circuit device 1, external power supply voltage VDDL for logic and power supply voltage VDDH for DRAM are applied. The semiconductor integrated circuit device 1 includes a logic LG, a DRAM macro DM for storing data and a power-on detector 2.

The DRAM macro DM includes a memory cell array MA having a plurality of memory cells arranged in rows and columns, a row decoder RD for selecting an addressed row of the memory cell array MA, sense amplifiers SA for sensing, amplifying and latching data of a selected memory cell in the memory cell array MA, a write driver WD for writing data into a selected memory cell in the memory cell array MA, a control circuit CTL for controlling an operation necessary for memory cell selection in the memory cell array MA, data writing/reading and such, and an internal voltage generation circuit IVGA for generating an array power supply voltage (power supply voltage for sense amplifier) VDDS and a boosted voltage VPP from the DRAM power supply voltage VDDH.

The array power supply voltage VDDS is applied to the sense amplifier SA as one operation power supply voltage and also to the write driver WD as one operation power supply voltage. The boosted voltage VPP is applied to the row decoder RD as an example. The control circuit CTL and the logic LG receive the logic power supply voltage VDDL as an operation power supply voltage.

The row decoder RD, driving a selected word line to the boosted voltage VPP level, receives a signal of the logic power supply voltage VDDL level from the control circuit CTL to generate a signal of the boosted voltage VPP level. The write driver WD receives an external signal having an amplitude of the logic power supply voltage VDDL level to generate internal write data having an amplitude of the array power supply voltage VDDS level. In the row decoder RD and the write driver WD, so-called level conversion circuits are provided.

The power-on detector 2 includes a power-on detection circuit 10 for detecting power-on of the logic power supply voltage VDDL and holding a power-on detection signal (power-on reset signal) /PORL at an active state while the logic power supply voltage VDDL is unstable (L level), a power-on detection circuit 11 coupled to receive the DRAM power supply voltage VDDH for holding, at the power-on of the DRAM power supply voltage VDDH, a power-on detection signal (power-on reset signal) /PORH at the active state (L level) until the power supply voltage VDDH becomes stable, and a main power-on detection circuit 12 responsive to these power-on detection signals /PORL and /PORH for maintaining a main power-on detection signal /POROH at the active state (L level) when at least one of the power-on detection signals is active. The main power-on detection signal /POROH from the main power-on detection circuit 12 is applied to the row decoder RD, the write driver WD and others in the DRAM macro DM. In other words, the main power-on detection signal /POROH is applied to a circuit part having the level conversion function.

Figure 2:
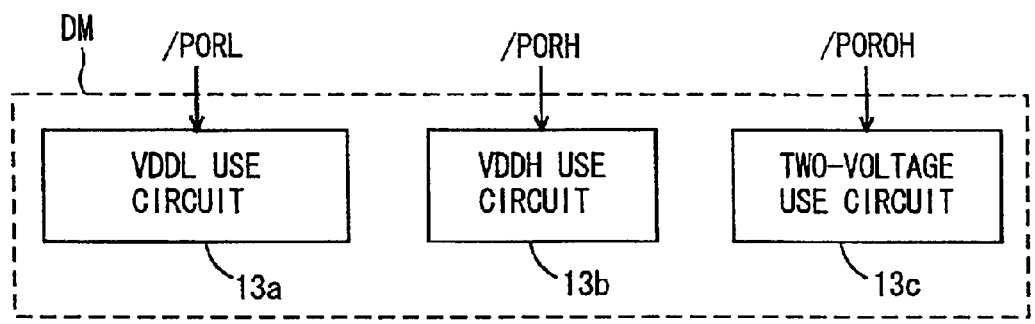
FIG. 2 is a diagram schematically showing distribution of power-on detection signals in the semiconductor integrated circuit device according to the present invention.

FIG. 2 is a diagram schematically showing a structure of the circuit that receives the power-on detection signals. In FIG. 2, the DRAM macro DM includes a VDDL use circuit 13a to be maintained at an inactive state when the power-on detection signal /PORL is activated, a VDDH use circuit 13b to be maintained at the inactive state when the power-on detection signal /PORH is activated, and a two-voltage use circuit 13c to be reset to an initial state when the main power-on detection signal /POROH is activated. The VDDL use circuit 13a is, for example, a peripheral control circuit included in the control circuit CTL, which uses the logic power supply voltage VDDL and has no level conversion function. The VDDH use circuit 13b is a circuit using the DRAM power supply voltage VDDH higher than the array power supply voltage VDDS, which is, for example, a bit line equalization control signal generation circuit. The VDDH use circuit 13b may be a circuit for generating a control signal to power supply circuitry for supplying the DRAM power supply voltage VDDH, or may be a power source circuit for generating an internal voltage from the DRAM power supply voltage VDDH. The two-voltage use circuit 13c is a circuit using two voltages of different voltage levels and having the level conversion function and may include the row decoder RD and the write driver WD shown in FIG. 1. The two-voltage use circuit 13c, as will be described in detail later, may include a word driver, a main word line driver and a sub-decoding signal generation unit in a hierarchical word line structure, a circuit for generating a boosted signal such as a bit line isolation designation signal generation unit in a shared sense amplifier structure, and a circuit for converting a signal of an amplitude of a periphery power supply voltage (logic power supply voltage VDDL) into $a_{13}$ signal having an amplitude of the array power supply voltage VDDS level such as a column decoder generating a column select signal.

The main power-on detection circuit 12 maintains the main power-on detection signal /POROH at the active state when at least one of the power-on detection signals /PORL and /PORH is at the active state. In other words, the power-on detection signal /POROH holds the active state until both of the power supply voltages VDDL and VDDH are stabilized. In a level conversion circuit and the like using different voltages, therefore, its internal node is reset at the initial state until these power supply voltages VDDL and VDDH are reliably stabilized, which prevents a voltage level of the internal node from going up to an intermediate voltage level and accordingly prevents generation of a through current and circuit malfunction.

The amplitude of the power-on detection signal /PORL from the power-on detection circuit 10 is at the logic power supply voltage VDDL level, while the amplitude of the power-on detection signal /PORH from the power-on detection circuit 11 is at the DRAM power supply voltage VDDH level. The amplitude of the main power-on detection signal /POROH from the main power-on detection circuit 12 is at the DRAM power supply voltage VDDH level. This is because a signal of the amplitude VDDL is to be converted into a signal having an amplitude of an internal voltage level such as the amplitude VPP.

In the power-on detection circuits 10 and 11 that are realized by a normal power-on detection circuit structure, a capacitor and a resistance element detect, in combination, a target power supply voltage level by a capacitive coupling or a charged voltage of the capacitor, and an inverter circuit detects a voltage level of a connection node between the capacitor and the resistance element to generate the power-on detection signal /PORL or /PORH.

Figure 3:
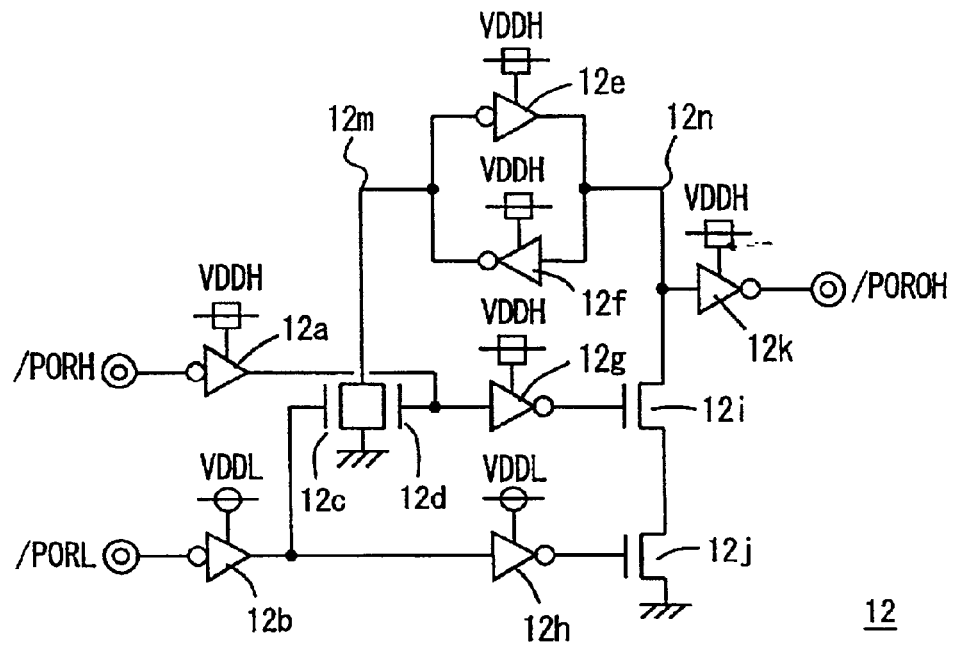
FIG. 3 is a diagram showing one example of a structure of a main power-on detection circuit shown in FIG. 1.

FIG. 3 is a diagram showing one example of a structure of the main power-on detection circuit 12 illustrated in FIG. 1. In FIG. 3, the main power-on detection circuit 12 includes an inverter 12a receiving the power supply voltage VDDH as an operation power supply voltage for inverting the power-on detection signal /PORH, an inverter 12b receiving the logic power supply voltage VDDL and inverting the power-on detection signal /PORL, an N channel MOS transistor 12d rendered conductive to couple a node 12m to a ground node when the output signal of the inverter 12a is at the "H" level, an N channel MOS transistor 12c rendered conductive to couple the node 12m to the ground node when the output signal of the inverter 12b is at the "H" level, an inverter 12e for inverting a signal/voltage of the node 12m for transmission to a node 12n, and an inverter 12f for inverting a signal of the node 12n for transmission to the node 12m. The inverters 12e and 12f receive the power supply voltage VDDH as an operation power supply voltage and constitute an inverter latch.

The main power-on detection circuit 12 further includes an inverter 12k receiving the power supply voltage VDDH as an operation power supply voltage and inverting a signal on the node 12n to generate the main power-on detection signal /PORH, an inverter 12g receiving the power supply voltage VDDH as an operation power supply voltage and inverting the output signal of the inverter 12a, an inverter 12h receiving the power supply voltage VDDL as an operation power supply voltage and inverting the output signal of the inverter 12b, and N channel MOS transistors 12i and 12j connected in series between the node 12n and the ground node. The MOS transistor 12i receives the output signal of the inverter 12g at its gate and the MOS transistor 12j receives the output signal of the inverter 12h at its gate. Now, operation of the main power-on detection circuit illustrated in FIG. 3 will be described with reference to signal waveform diagrams shown in FIGS. 4 and 5.

Figure 4:
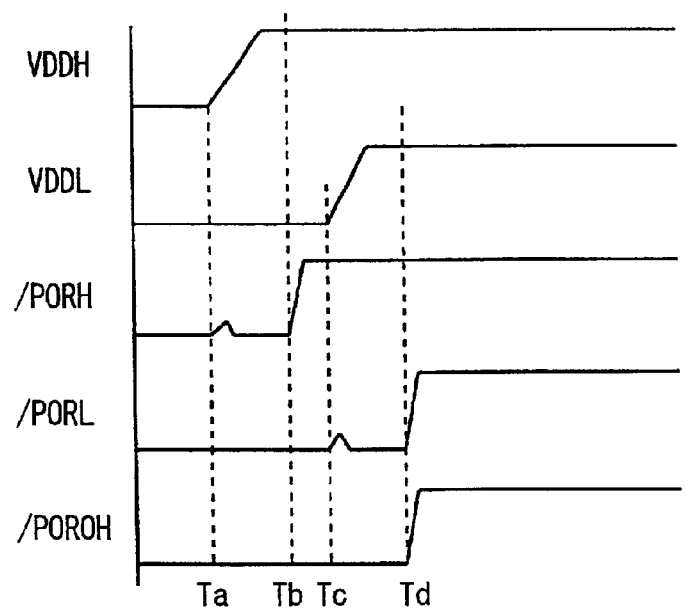
FIG. 4 is a signal waveform diagram representing an operation of the main power-on detection circuit illustrated in FIG. 3.

First, description will be made of operation performed when the power supply voltage VDDH is first applied or powered on with reference to FIG. 4. The power supply voltage VDDH is powered on at time Ta and has its voltage level increased. Although the power-on detection signal /PORH has its voltage level increased in response to the application of the power supply voltage VDDH, it is immediately fixed at the "L" level. When the power supply voltage VDDH is stabilized, the power-on detection signal /PORH rises to the "H" level at time Tb. While the power-on detection signal /PORH is at the "L" level, a signal of the "H" level of the power supply voltage VDDH level is output from the inverter 12a to turn on the MOS transistor 12d to initialize the node 12m at the ground voltage level (reset). In response to the application or power-on of the power supply voltage VDDH, the inverters 12e and 12f operate to latch the "L" level signal of the node 12m, and the node 12n responsively attains the "H" level. At this time, since the power supply voltage VDDL is not applied yet, the output signal of the inverter 12h is at the "L" level, the MOS transistor 12j is at the off state and the node 12n is held at the "H" level of the power supply voltage VDDH.

When the power supply voltage VDDL is applied or powered on at Tc, the power-on detection signal /PORL has its level once increased in response to the rising of the power supply voltage VDDL and then fixed at the "L" level. The output signal of the inverter 12b responsively attains the "H" level of the power supply voltage VDDL level to turn on the MOS transistor 12c. The node 12m is again reliably coupled to the ground node and held at the ground voltage level.

When the power supply voltage VDDL is stabilized at time Td, the power-on detection signal /PORL attains the "H" level and the output signal from the inverter 12h responsively attains the "H" level of the power supply voltage VDDL. Responsively, the MOS transistors 12i and 12j are both turned on to discharge the node 12n to the ground voltage level, so that the main power-on detection signal /POROH from the inverter 12k attains the "H" level. Thus, when both of the power supply voltages VDDL and VDDH attain the stable state, the main power-on detection signal /PQRQH enters the "H" level inactive state.

Figure 5:
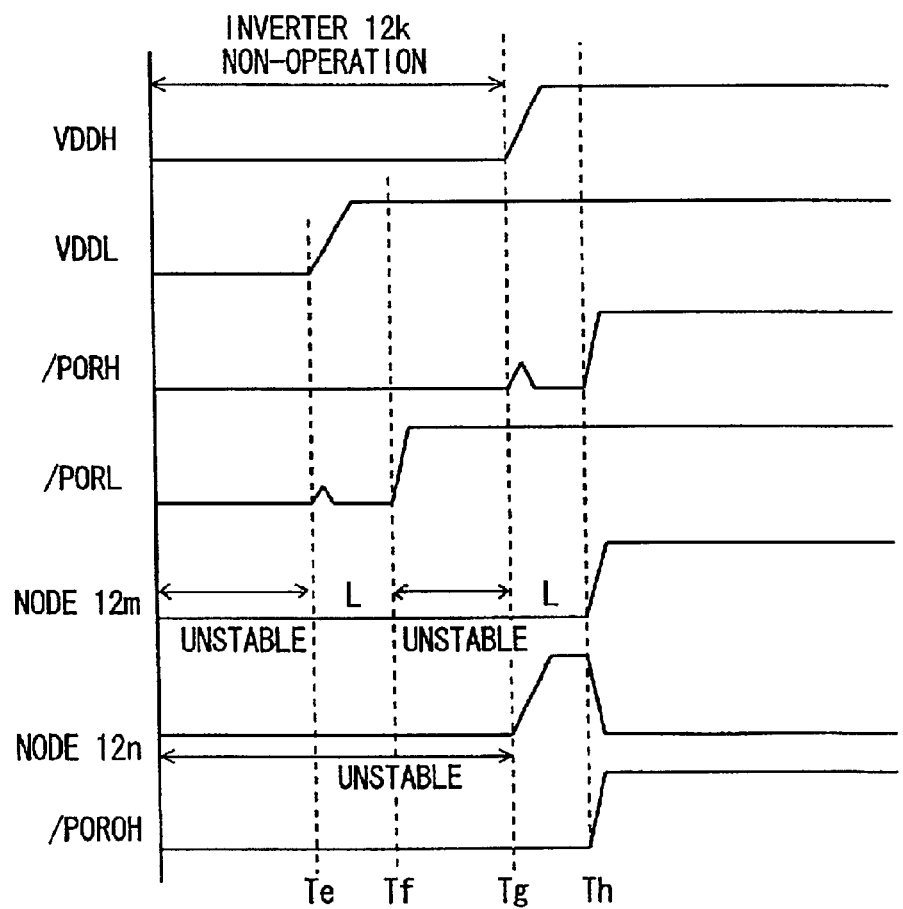
FIG. 5 is a signal waveform diagram representing an operation of the main power-on detection circuit illustrated in FIG. 3.

Next, description will be made of a case where the power supply voltage VDDL is first applied with reference to FIG. 5. At time Te, the power supply voltage VDDL is applied or powered on to settle the power-on detection signal /PORL at the "L" level. At this time, the output signal of the inverter 12b attains the "H" level of the power supply voltage VDDL and the MOS transistors 12c is responsively turned on to fix the node 12m at the ground voltage level. Because the power supply voltage VDDH is not applied yet, the output signals of the inverters 12e and 12f are both at the "L" level. Under this state, although the voltage level of the node 12n is unstable, the node 12m is at the "L" level and is coupled to a power supply node supplying the power supply voltage VDDH through the P channel MOS transistor in the inverter 12e and is, at worst, fixed at a voltage level of an absolute value of a threshold voltage of the P channel MOS transistor of the inverter 12e. Also in this case, since the power supply voltage VDDH is not supplied yet, no through current flows through the inverter 12k at the output stage, and no problem is caused. The node 12n is also stably fixed at the "L" level (threshold voltage of the MOS transistor is ignored here). The inverter 12h also outputs a "L" level signal because the power-on detection signal /PORL is at the "L" level. The main power-on detection signal /POROH maintains the "L" level because the power supply voltage VDDH is not applied to the inverter 12k. Therefore, even though the voltage level of the node 12n is going up, no adverse effect is exerted on the voltage level of the power-on detection signal /POROH.

At time Tf, the power-on detection signal /PORL attains the "H" level and the output signal of the inverter 12h responsively attains the "H" level (power supply voltage VDDL level) to turn on the MOS transistor 12j, while the MOS transistor 12c is turned off because the output signal of the inverter 12b attains the "L" level. Since the power supply voltage VDDH is not yet applied, the node 12m is disconnected from the ground node. The nodes 12m and 12n are coupled to the power supply voltage node supplying the power supply voltage VDDH through the inverters 12e and 12f and maintain the "L" level. Even under this state, since the power supply voltage VDDH is not yet applied, the power-on detection signal /POROH maintains the "L" level.

At time Tg, the power supply voltage VDDH is applied to have its voltage level increased. With the power-on detection signal /PORH at the "L" level, the MOS transistor 12d is turned on to drive the node 12m to the ground voltage level, so that the node 12n is driven to the "H" level which in turn is latched by the inverters 12e and 12f. Since the node 12n is charged to the "H" level (power supply voltage VDDH level), the inverter 12k holds the main power-on detection signal /POROH at the "L" level.

When the power-on detection signal /PORH rises to the "H" level at time Th, the MOS transistor 12i is turned on and the MOS transistor 12d is turned off. MOS transistors 12i and 12j are both turned on to discharge the node 12n to the ground voltage level to bring the main power-on detection signal /POROH from the inverter 12k to the "H" level.

Here, a current-drivability of the inverter 12e is set to be smaller enough than those of the MOS transistors 12i and 12j.

Accordingly, also in a case where the power supply voltage VDDL is first applied, when both of the power supply voltages VDDL and VDDH are stabilized, the main power-on detection signal /POROH is driven to the "H" level.

Figure 6:
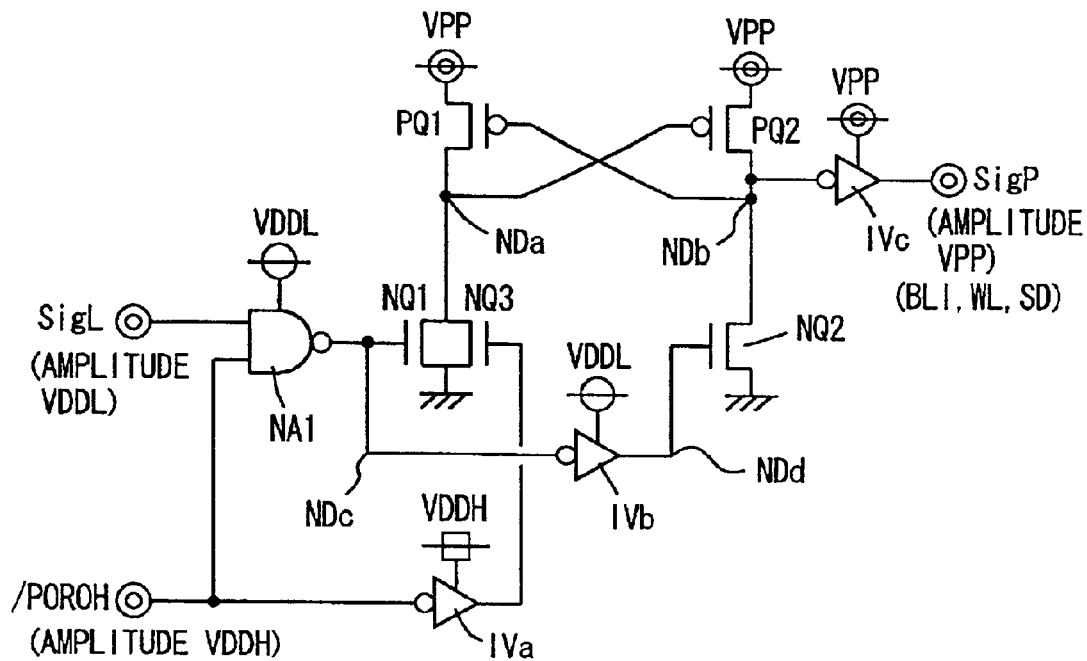
FIG. 6 is a diagram showing one example of a structure of a two-voltage use circuit illustrated in FIG. 2.

FIG. 6 is a diagram showing one example of a structure of the level conversion circuit. In FIG. 6, the level conversion circuit includes an NAND circuit NA1 receiving an input signal SigL having an amplitude of the power supply voltage VDDL level and the main power-on detection signal /POROH, an N channel MOS transistor NQ1 coupled between a node NDa and a ground node and having a gate receiving the output signal of the NAND circuit NA1, an inverter IVa receiving the main power-on detection signal /POROH, an inverter IVb receiving the output signal of the NAND circuit NA1, an N channel MOS transistor NQ2 coupled between a node NDb and the ground node and having a gate receiving the output signal of the inverter IVb, an N channel MOS transistor NQ3 coupled between the node NDa and the ground node and having a gate receiving the output signal of the inverter IVa, a P channel MOS transistor PQ1 coupled between a boosted power supply node receiving the boosted voltage VPP and the node NDa and having a gate coupled to the node NDb, a P channel MOS transistor PQ2 coupled between the boosted power supply node and the node NDb and having a gate coupled to the node NDa, and an inverter IVc receiving the boosted voltage VPP as an operation power supply voltage and inverting the signal of the node NDb to generate an output signal SigP having an amplitude of the boosted voltage VPP level.

The inverter IVb receives the logic power supply voltage VDDL as an operation power supply voltage, while the inverter IVa receives the DRAM power supply voltage VDDH as an operation power supply voltage. The inverter IVb is used for level conversion and the inverter IVa is used for resetting the internal nodes at the time of power on. Now, operation of the level conversion circuit illustrated in FIG. 6 will be briefly described.

When the main power-on detection signal /POROH is at the "L" level, if the power supply voltage VDDH is applied and the power supply voltage VDDL is not yet applied, the output signal of the inverted IVa attains the "H" level in response to the power supply voltage VDDH to turn on the MOS transistor NQ3, whereby the node NDa is reset at the ground voltage level. Since the power supply voltage VDDL is not yet applied, both of the output signals of the NAND circuit NA1 and the inverter IVb are at the "L" level. Since the boosted voltage VPP is generated according to the power supply voltage VDDH, the voltage level of the boosted voltage VPP is accordingly increased according to the power supply voltage VDDH. Since the node NDa is at the "L" level (being reset), the MOS transistor PQ2 is turned on to drive the node NDb to the boosted voltage VPP level, so that the output signal SigP is maintained at the "L" level.

When the power supply voltage VDDL is applied, if the main power-on detection signal /POROH is at the "L" level, the output signal of the NAND circuit NA1 attains the "H" level and the output signal of the inverter IVb responsively attains the "L" level. Since the node NDa is driven to the ground voltage level by the MOS transistors NQ1 and NQ3, it maintains the "L" level of the ground voltage level.

When both of the power supply voltages VDDH and VDDL are stabilized and the main power-on detection signal /POROH attains the "H" level, the output signal of the inverter IVa attains the "L" level. At this time, the output signals of the NAND circuit NA1 and the inverter IVb are determined according to a logical level of the input signal SigL. When the input signal SigL is at the "L" level, the output signal of the NAND circuit NA1 is at the "H" level, so that the output signal SigP maintains the "L" level. On the other hand, when the input signal SigL is at the "H" level, the output signal of the NAND circuit NA1 attains the "L" level and the output signal of the inverter IVb attains the "H" level, so that the node NDb is discharged to the ground voltage level by the MOS transistor NQ2. Responsively, the output signal SigP is driven to the boosted voltage VPP level.

When the power supply voltage VDDL is applied first, with the main power-on detection signal /POROH being at the "L" level, the node NDc attains the "H" level in response to the power supply voltage VDDL and the node NDa is held at the ground voltage level. When the output signal of the NAND circuit NA1 is at the "H" level, the output signal of the inverter IVb is at the "L" level. At this state, since the power supply voltage VDDH is not yet applied, the boosted voltage VPP is at the "L" level, whereby no through current flows through the inverter IVc.

When the power supply voltage VDDH is applied, the voltage level of the boosted voltage VPP is increased. With the node NDa being fixed at the "L" level, at the time of the increase in the voltage level of the boosted voltage VPP, no through current flows in the inverter IVc. When the power-on detection signal /POROH attains the "H" level, the output signal SigP is generated according to the input signal SigL.

Thus, when the power supply voltage VDDH is applied and the power supply voltage VDDL is not yet applied, the main power-on detection signal /POROH attains the "L"

level and the node NDa is responsively fixed to the "L" level by the MOS transistor NQ3. Also when the boosted voltage VPP is generated by the power supply voltage VDDH, the node NDb is held at the boosted voltage VPP level. Accordingly, even when both of the nodes NDc and NDd are at the "L" level, the node NDa is driven to the "L" level and the node NDb is driven to the boosted voltage VPP level, and therefore is prevented from being held at the intermediate voltage level to suppress a through current in the inverter IVc.

In addition, use of the NAND circuit NA1 can prevent the voltage level of the internal node NDa from going up. More specifically, when the power supply voltage VDDL is applied before application of the power supply voltage VDDH, the main power-on detection signal /POROH is at the "L" level, and therefore it is possible to drive the node NDc to the "H" level to hold the node NDa at the "L" level. In a case where the boosted voltage VPP is not generated and is at the "L" level, the node NDa is fixed at the "L" level by the MOS transistor NQ1, the node NDb is, at worst, fixed at a voltage level of an absolute value of the threshold voltage of the MOS transistor PQ2. Under this state, even when the power supply voltage VDDH and the boosted voltage VPP rise, the node NDa is fixed at the "L" level (power-on detection signal /POROH is at the "L" level), and drive of the node NDb to the boosted voltage VPP level can be prevented, thereby preventing the input signal of the inverter IVc ("H" level during this operation period) from attaining the intermediate voltage level to suppress a through current.

The output signal SigP is used as a word line driving signal WL, or a sub-decoding signal applied to a sub-word line driver (signal for sub-word line selection) in the hierarchical word line structure or a bit line isolation instruction signal BLI.

[Modification of Level Conversion Circuit]

Figure 7:
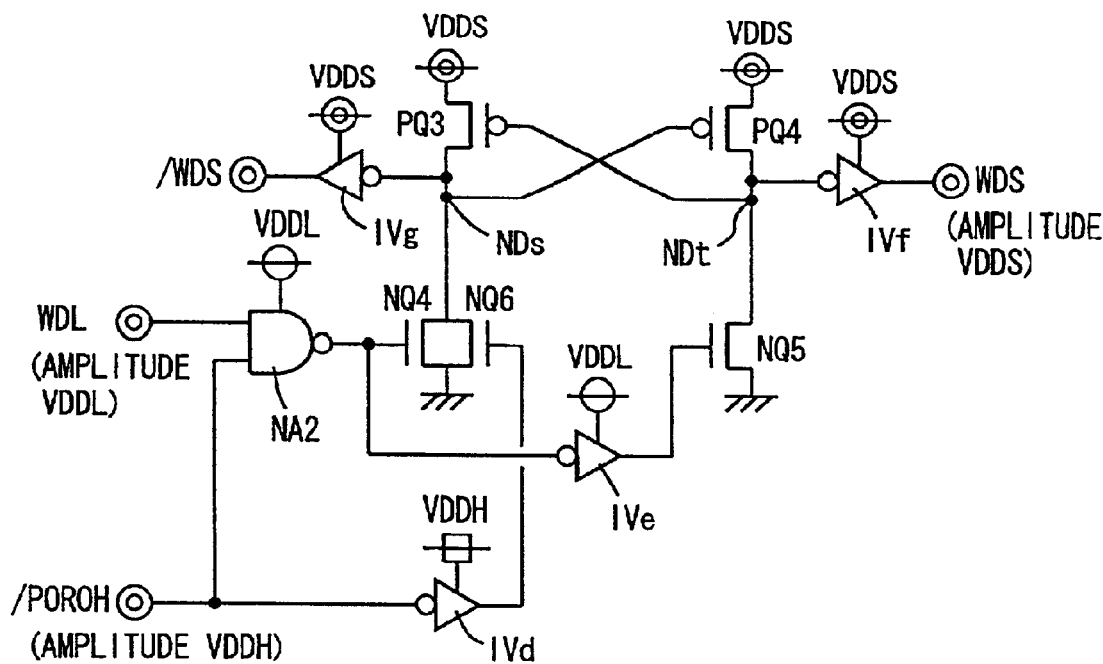
FIG. 7 is a diagram showing another structure of the two-voltage use circuit illustrated in FIG. 2.

FIG. 7 is a diagram showing an example of modification of the level conversion circuit. The level conversion circuit shown in FIG. 7 is, for example, a write drive circuit included in the write driver WD illustrated in FIG. 1, and converts an input signal WDL of the amplitude VDDL into a signal of the amplitude VDDS (internal write data).

In FIG. 7, the write drive circuit includes an NAND circuit NA2 receiving the power supply voltage VDDL as an operation power supply voltage and receiving the write data WDL of the amplitude VDDL and the main power-on detection signal /POROH, an inverter IVd receiving the power supply voltage VDDH as an operation power supply voltage and inverting the main power-on detection signal /POROH, an inverter IVe receiving the power supply voltage VDDL as an operation power supply voltage and inverting the output signal of the NAND circuit NA2, an N channel MOS transistor NQ4 responsive to the output signal of the NAND circuit NA2 for selectively coupling a node NDs to a ground node, an N channel MOS transistor NQ5 responsive to the output signal of the inverter IVe for selectively coupling a node NDt to the ground node, an N channel MOS transistor NQ6 responsive to the output signal of the inverter IVd for coupling the node NDs to the ground node, a P channel MOS transistor PQ3 coupled between an array power supply node for supplying the array power supply voltage VDDS and the node NDs and having a gate coupled to the node NDt, a P channel MOS transistor PQ4 coupled between the array power supply node and the node NDt and having a gate connected to the node NDs, an inverter IVf receiving the array power supply voltage VDDS as an operation power supply voltage and inverting a signal on the node NDt to generate internal write data WDS, and an inverter IVg receiving the array power supply voltage VDDS as an operation power supply voltage and inverting a signal of the node NDs to generate complimentary internal write data /WDS.

The write drive circuit illustrated in FIG. 7 bistate-drives the internal write data WDS and /WDS and does not enter an output high impedance state. In other words, the write drive circuit illustrated in FIG. 7 is applied to a structure in which a read data line and a write data line are provided separately and no write data line is precharged.

In the write drive circuit (level conversion circuit) illustrated in FIG. 7, similarly to the structure of the level conversion circuit shown in FIG. 6, the output signal of the NAND circuit NA2 or the output signal of the inverter IVd is set at the "H" level to fix the node NDs at the ground voltage level while the main power-on detection signal /POROH is at the "L" level irrespective of the sequence of application of the power supply voltages VDDL and VDDH. When the power supply voltage VDDH is applied before application of the power supply voltage VDDL, the array power supply voltage VDDS is generated according to the DRAM power supply voltage VDDH. Accordingly, when the node NDs is initialized at the "L" level, the node NDt is precharged to the array power supply voltage VDDS level by the MOS transistor PQ4. As a result, the nodes NDs and NDt can be prevented from having their voltage levels going up to an intermediate voltage level between the power supply voltage and the ground voltage, thereby preventing a through current in the inverters IVf and IVg. At this time, the internal write data WDS and /WDS attain the "L" level and "H" level, respectively, according to the power supply voltage VDDS.

When the power supply voltage VDDL is applied before application of the power supply voltage VDDH, the output signal of the NAND circuit NA2 attains the "H" level according to the power supply voltage VDDL and the node NDs is driven to the ground voltage level by the MOS transistor NQ4. When the power supply voltage VDDH is not yet applied, the array power supply voltage VDDS still remains at the "L" level. Accordingly, the inverters IVf and IVg receive no operation power supply voltage, and cause no through current. When the power supply voltage VDDH is applied and the array power supply voltage is increased in voltage level, the voltage level of the node NDt increases as the voltage level of the array power supply voltage VDDS increases because the node NDs is fixed at the ground voltage level. The voltage level of the node NDt is therefore at the logical high level with respect to the inverter IVf all the time, so that at the application of the power supply voltage VDDH, no through current is generated at the inverters IVf and IVg.

When the power-on detection signal /POROH enters the "H" level inactive state, the output signal of the inverter IVe attains the "L" level and the NAND circuit NA2 generates an output signal according to the voltage level of the internal write data WDL. The voltage levels of the internal write data WDS and /WDS are accordingly determined according to the internal write data WDL as well.

Figure 8:
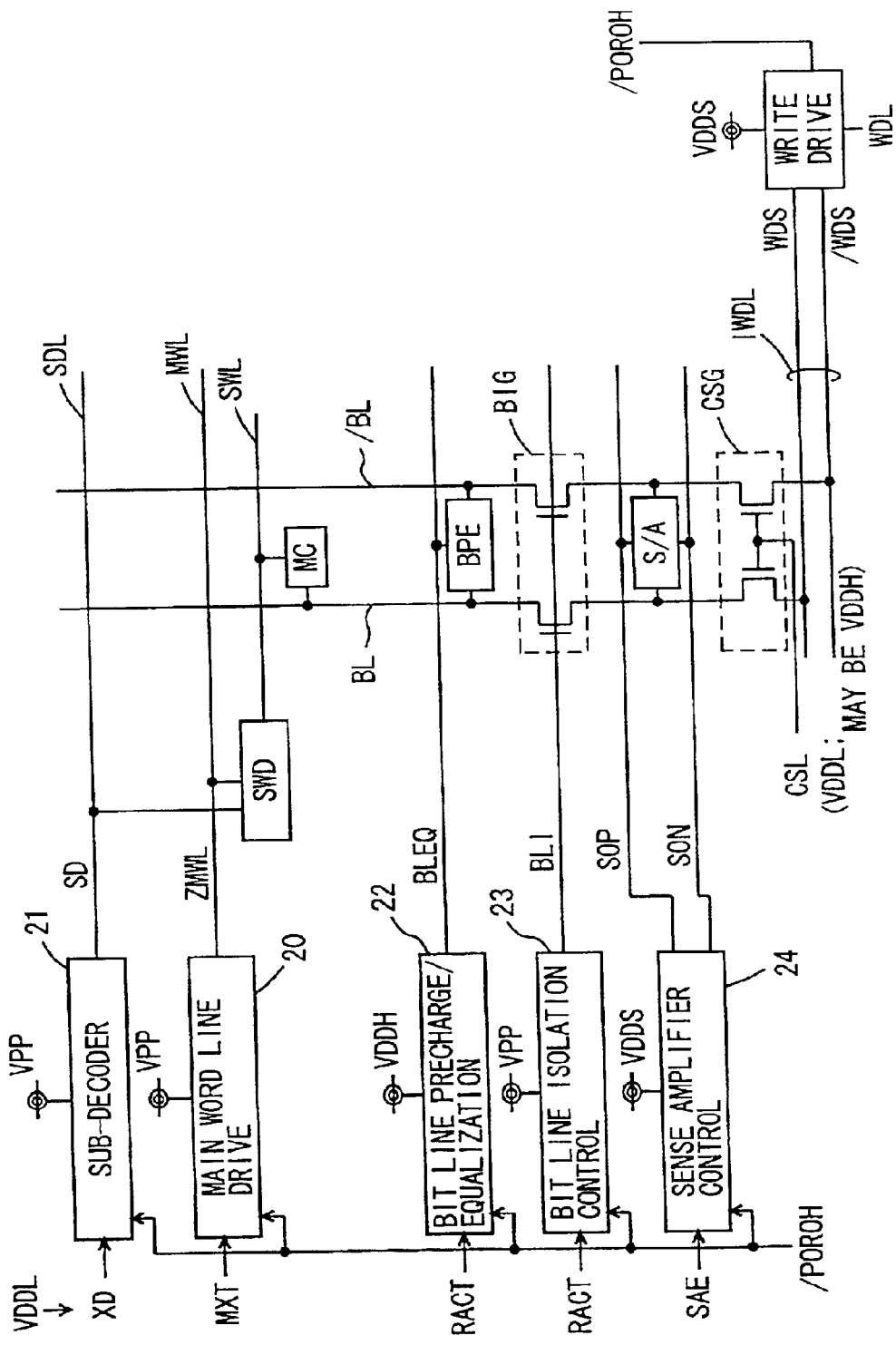
FIG. 8 is a diagram schematically showing a structure of a main part of a semiconductor storage device according to a first embodiment of the present invention.

FIG. 8 is a diagram schematically showing a structure of a main part of a semiconductor storage device according to the first embodiment of the present invention. A sub-word line SWL is disposed corresponding to each row of memory cells MC and bit lines BL and /BL are disposed corresponding to each column of memory cells MC. In FIG. 8, one sub-word line SWL and a pair of bit lines BL and /BL are representatively shown. The memory cell MC is arranged corresponding to a crossing between the sub-word line SWL and the bit line BL. The bit lines BL and /BL are coupled to a sense amplifier circuit S/A through a bit line isolation gate BIG. The sense amplifier circuit S/A is coupled to an internal write data line pair IWDL through a column selection gate CSG. A column selection signal CSL applied to the column selection gate CSG is shown having an amplitude of the power supply voltage VDDL. The column selection signal CSL, however, may have an amplitude of the array power supply voltage VDDH. When the column selection signal CSL has an amplitude of the array power supply voltage VDDH, the level conversion circuit is provided at a part for generating the column selection signal CSL.

To the internal write data line IWDL, a write drive circuit WDR is coupled. The write drive circuit WDR has the structure as shown in FIG. 7, and receives the array power supply voltage VDDS as an operation power supply voltage and generates complementary internal write data WDS and /WDS from write data WDL.

To the sub-word line SWL, a sub-word line drive circuit SWD is provided. The sub-word line drive circuit SWD drives the sub-word line SWL to a selected state (boosted voltage VPP level) in response to a main word line driving signal ZMWL on a main word line MWL and a sub-decode signal SD on a sub-decode signal transmission line SDL. Although a complementary sub-decoding signal /SD is used as well, it is not illustrated in the figure.

The main word line MWL is provided in common for a plurality of sub-word lines SWL arranged in the same row or a predetermined number of rows. The main word line MWL is driven by a main word line drive circuit 20. The main word line drive circuit 20 is included in the row decoder RD and receives a high voltage VPP as an operation power supply voltage to generate the main word line driving signal ZMWL of the amplitude VPP in response to a word line selection signal MXT (amplitude at VDDL level) from the row decoder circuit. The main word line drive circuit 20 includes the previously described structure as illustrated in FIG. 6. The main word line drive circuit 20 may drive its corresponding main word line MWL in response to a signal of the amplitude VPP from the circuit shown in FIG. 6. In this case, the structure of FIG. 6 is disposed between the row decoder circuit and an associated main word line drive circuit.

The sub-decode signal transmission line SDL is coupled to a sub-decoder 21. The sub-decoder 21 predecodes a predecode signal XD to generate a sub-decode signal SD having an amplitude of the high voltage VPP level. The sub-decode signal has the amplitude VPP and transmitted onto a selected sub-word line through the sub-word line drive circuit SWD.

To the bit lines BL and /BL, a bit line precharge/equalization circuit BPE is provided for precharging the bit lines BL and /BL to a voltage level of the intermediate voltage (=VDDS/2) in the stand-by state. The bit line precharge/equalization circuit BPE has its precharging/equalizing operation controlled by a bit line equalization designation signal BLEQ from a bit line precharge/equalization control circuit 22. The bit line precharge/equalization control circuit 22 receives the DRAM power supply voltage VDDH. The control circuit 22 generates the bit line equalization designation signal BLEQ of the amplitude VDDH in response to a row selection operation activation signal RACT (amplitude VDDL level) from an internal row-related control circuit.

The bit line isolation gate BIG has its conduction/non-conduction controlled by a bit line isolation instructing signal BLI from a bit line isolation control circuit 23. The bit line isolation control circuit 23 generates the bit line isolation instructing signal BLI of the amplitude VPP level in response to the row selection operation activation signal RACT (amplitude VDDL).

The sense amplifier circuit S/A is coupled to a sense power supply line and a sense ground line not shown in response to sense amplifier activation signals SOP and SON from a sense amplifier control circuit 24 to perform sensing operation. The sense amplifier control circuit 24 generates the sense amplifier activation signals SOP and SON of the amplitude VDDS in response to a sense amplifier enable signal SAE (amplitude VDDL).

The bit line precharge/equalization control circuit 22, the bit line isolation control circuit 23, the sense amplifier control circuit 24, the main word line drive circuit 20 and the sub-decoder 21 have the same structures as those of the level conversion circuit illustrated in FIG. 6 and each receives the high voltage VPP, or the DRAM power supply voltage VDDH or the array power supply voltage VDDS according to the amplitude of its output signal. To the main word line drive circuit 20, the sub-decoder 21, the bit line precharge/equalization control circuit 22, the bit line isolation control circuit 23 and the sense amplifier control circuit 24, the main power-on detection signal /POROH is applied. Also the write drive circuit WDR, the main power-on detection signal /POROH is applied. Also to the write drive circuit WDR, the main power-on detection signal /POROH is applied.

The sense amplifier circuit S/A is shared by adjacent pairs of bit lines to constitute a shared sense amplifier structure. In this case, the memory array is divided into blocks and to each control signal generation unit illustrated in FIG. 8, a block selection signal is applied. The block selection signal is at the amplitude VDDL level and each control signal or a combined signal of a decode signal and a block selection signal is applied to each of the circuits 20 to 24.

The main word line MWL is provided per a predetermined number of the memory cell row(s) in the memory cell array and the main word line drive circuit 20 is accordingly provided. It is therefore possible to reduce current consumption at the time of power-on by suppressing a through current in a buffer at the output stage at the time of power-on.

In a DRAM integrated together with a logic on the same semiconductor chip, the column selection signal CSL is disposed extending in a row direction, while the write data line pair IWDL is disposed extending in a column direction over the memory array. In this case, for example, 128-bit write data line pairs IWDL are disposed. It is therefore possible to reduce current consumption of the entire write driver at the time of power-on by reducing current consumption of the write drive circuit WDR at the time of power-on.

Although no specific structure of the bit line precharge/equalization control circuit 22 is shown, using the DRAM power supply voltage VDDH in place of the high voltage VPP in the level conversion circuit structure illustrated in FIG. 6 implements a level conversion circuit constituting the bit line precharge/equalization control circuit 22.

As described in the foregoing, according to the first embodiment of the present invention, with a power-on detection circuit provided for each power source in a multi-power structure, a power-on detection signal applied to a level conversion circuit is activated to reset an internal node while at least one power-on detection signal is at the active state, so that a through current at the level conversion circuit can be prevented irrespective of the sequence of application of power, thereby reducing current consumption at the time of power-on.

[Second Embodiment]

Figure 9:
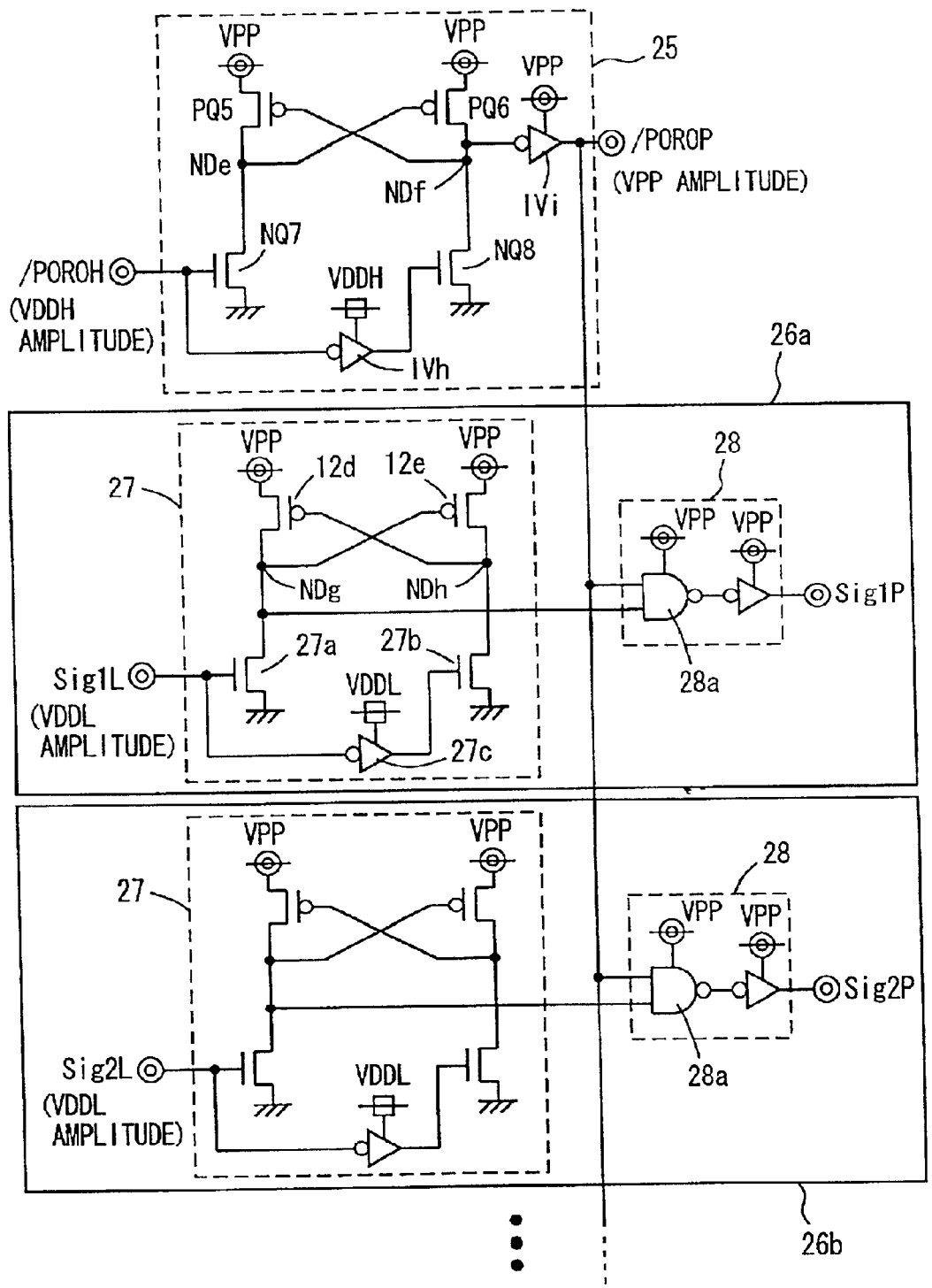
FIG. 9 is a diagram schematically showing a structure of a main part of a semiconductor integrated circuit device according to a second embodiment of the present invention.

FIG. 9 is a diagram schematically showing a structure of a main part of a semiconductor integrated circuit device according to the second embodiment of the present invention. In FIG. 9, there is shown a circuit for converting a signal SigL of an amplitude VDDL into a signal SigP having an amplitude of a high voltage VPP level. FIG. 9 representatively shows an internal drive circuit 26a for converting a signal Sig1L into a signal Sig1P of the amplitude VPP and an internal drive circuit 26b for converting a signal Sig2L of the amplitude VDDL into a signal Sig2P of the amplitude VPP. These internal drive circuits 26a and 26b correspond to the main word line drive circuit 20, the sub-decoder 21 and the bit line isolation control circuit 23 using the high voltage VPP as an operation power supply voltage in the structure shown in FIG. 8.

Each of the internal drive circuits 26a and 26b includes a level conversion circuit 27 for converting the input signal SigL (Sig1L, Sig2L) into a signal of the high voltage VPP level and a buffer circuit 28 for buffering the output signal of the level conversion circuit 27 to generate a signal SigP (Sig1P, Sig2P) of the amplitude VPP level. The buffer circuit 28 includes an NAND circuit 28a and an inverter receiving the output signal of the NAND circuit 28a for generating the signal SigP.

A converting voltage application detection circuit 25 is provided commonly for the drive circuits 26a, 26b . . . The converting voltage application detection circuit 25 converts the main power-on detection signal /POROH from the main power-on detection circuit 12 shown in FIG. 1 into a converted voltage application detection signal /POROP of the amplitude VPP level. The converted voltage application detection signal /POROP is applied to the NAND circuit 28a at the first stage of the buffer circuit 28 of each of the internal drive circuits 26a, 26b, . . . .

The converting voltage application detection circuit 25 includes an N channel MOS transistor NQ7 coupled between a node NDe and a ground node and having a gate receiving the main power-on detection signal /POROH, an inverter IVh receiving the main power-on detection signal /POROH, an N channel MOS transistor NQ8 responsive to the output signal of the inverter IVh for coupling a node NDf to the ground node, a P channel MOS transistor PQ5 coupled between a boosted voltage supply node and the node NDe and having a gate coupled to the node NDf, a P channel MOS transistor PQ6 coupled between the boosted voltage supply node and the node NDf and having a gate coupled to the node NDe, and an inverter IVi for inverting the output signal of the node NDf to generate the converted voltage application detection signal /POROP. The inverter IVh receives the DRAM power supply voltage VDDH as an operation power supply voltage, while the inverter IVi receives the boosted voltage VPP as an operation power supply voltage.

In the internal drive circuits 26a and 26b, the level conversion circuits 27 all have the same structure and in FIG. 9, reference numerals are given only to components of the level conversion circuit 27 included in the internal drive circuit 26a. The level conversion circuit 27 includes an N channel MOS transistor 27a responsive to the input signal Sig1L for coupling a node NDg to a ground node, an inverter 27c receiving the input signal SigL, and an N channel MOS transistor 27b responsive to the output signal of the inverter 27c for coupling a node NDh to the ground node. From the node NDg, a signal to the buffer circuit 28 is taken out. The inverter 27c receives the logic power supply voltage VDDL as an operation power supply voltage.

Figure 10:
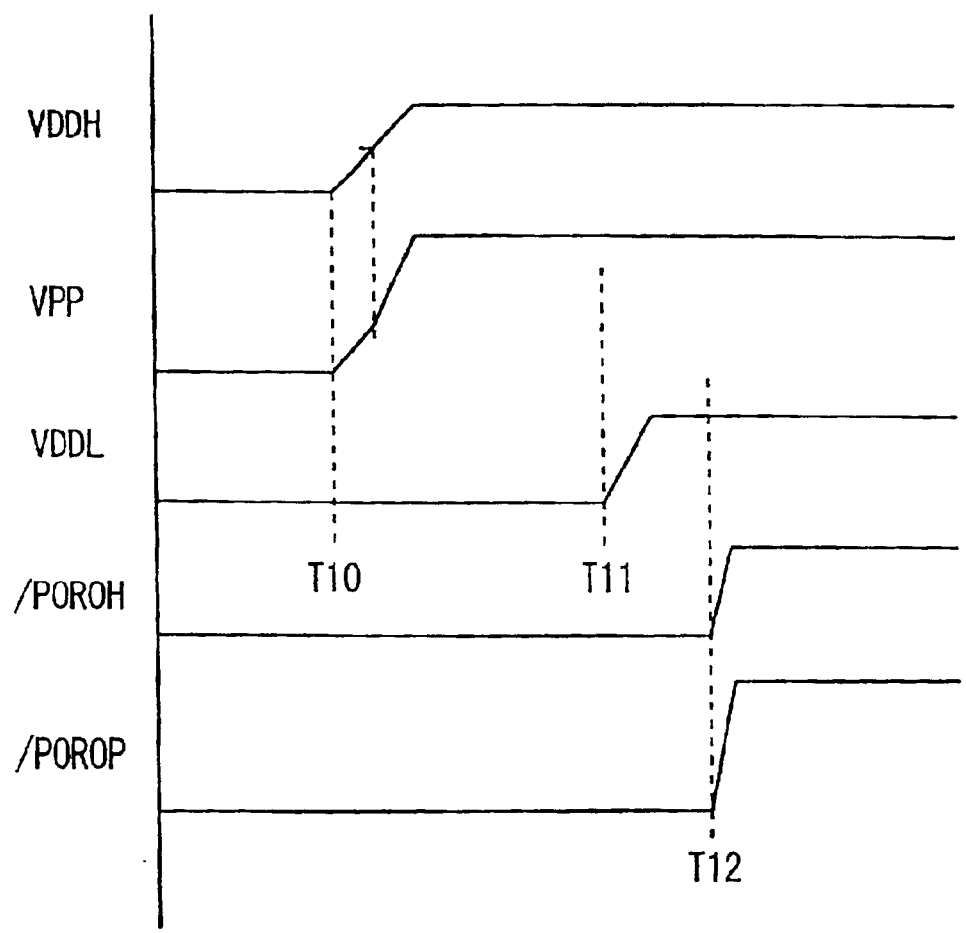
FIG. 10 is a signal waveform diagram representing an operation of a main power-on detection circuit illustrated in FIG. 9.

The level conversion circuit 27 further includes a P channel MOS transistor 12d connected between a boosted voltage supply node and the node NDg and having a gate connected to the node NDh and a P channel MOS transistor 12e connected between the boosted voltage supply node and the node NDh and having a gate connected to the node NDg. In the level conversion circuit 27, no NAND circuit is provided for initializing (resetting) a voltage level of the internal nodes NDg and NDh at the time of power application or power on. Now, operation in the structure shown in FIG. 9 will be described with reference to the signal waveform diagram illustrated in FIG. 10.

At time T10, the DRAM power supply voltage VDDH is applied to have its voltage level increased. In response to the application of the DRAM power supply voltage VDDH, the voltage level of the boosted voltage VPP increases. When the power supply voltage VDDH exceeds a certain voltage level, the boosted voltage VPP is increased at a high speed (because the boosting circuit completely performs charge pump operation).

Even when the power supply voltage VDDH and the boosted voltage VPP are stabilized, since the logic power supply voltage VDDL is not yet applied, the main power-on detection signal /POROH maintains the "L" level or the active state. Accordingly, at the converting voltage application detection circuit 25, the MOS transistor NQ7 is at the on state, the node NDf is driven to the boosted voltage VPP level and the converted voltage application detection signal /POROP outputted from the inverter IVi maintains the "L" level.

At time T11, the logic power supply voltage VDDL is applied to have its voltage level increased. When at time T12, the logic power supply voltage VDDL is stabilized, the main power-on detection signal /POROH attains the "H" level and the converted voltage application detection signal /POROP responsively attains the "H" level as well (boosted voltage VPP level).

Before time T12, since the converted voltage application detection signal /POROP is at the "L" level, in the internal drive circuits 26a, 26b . . . , the signals SigP from the buffer circuits 28 all attain the "L" level. Before time T11, there might be a case where at the level conversion circuit 27 of any of the internal drive circuits 26a and 26b, the input signal SigL (Sig1L, Sig2L) is at the "L" level and the output signal of the inverter 27c is also at the "L" level, so that the nodes NDg and NDh have their voltage levels increased to the intermediate voltage level. In the buffer circuit 28, however, due to the converted voltage application detection signal /POROP, even if the node NDg of the level conversion circuit 27 attains the intermediate voltage level, the output signal of the NAND circuit 28a at the first stage attains the "H" level, and the through current is prevented from flowing. In the level conversion circuit 27, the MOS transistors 27a and 27b are at the off state, and no through current flows therein. As a result, current consumption at the time of power-on can be reduced.

When the DRAM power supply voltage VDDH is applied after the logic power supply voltage VDDL is applied, in the internal drive circuits 26a, 26b . . . , the voltage level of the input signal SigL (Sig1L, Sig2L) of the level conversion circuit 27 is initialized according to the power-on detection signal /PORL for the logic power supply voltage VDDL, and one of the MOS transistors 27a and 27b is turned on and the other is turned off. In this case, however, the DRAM power supply voltage VDDH is not yet applied, and the boosted voltage VPP maintains the "L" level, and therefore, in this state, no through current flows through the buffer circuit 28.

When the DRAM power supply voltage VDDH is applied to increase the voltage level of the boosted voltage VPP, in the level conversion circuit 27 of each of the internal drive circuits 26a, 26b . . . , one of the nodes NDg and NDh is driven to the "L" level and the other to the boosted voltage VPP level. Even in this transient state, the converted voltage application detection signal /POROP maintains the "L" level, so that no through current flows through the buffer circuit 28. Also in the level conversion circuit 27, one of the nodes NDg and NDh has its voltage level increased according to the voltage level of the boosted voltage VPP. As a result, also in the level conversion circuit 27, there exists no path through which through-current flows, whereby current consumption at the time of power-on is reduced.

In the structure shown in FIG. 9, the level conversion circuit 27 of each of the internal drive circuits 26a, 26b . . . requires none of an NAND circuit and an inverter circuit for resetting (initialization) the voltage level of the internal nodes NDg and NDh, and an inverter and a MOS transistor for resetting the node NDg when the DRAM power supply voltage VDDH is applied, which enables reduction of an area occupied by the level conversion circuit.

[Modification 1]

Figure 11:
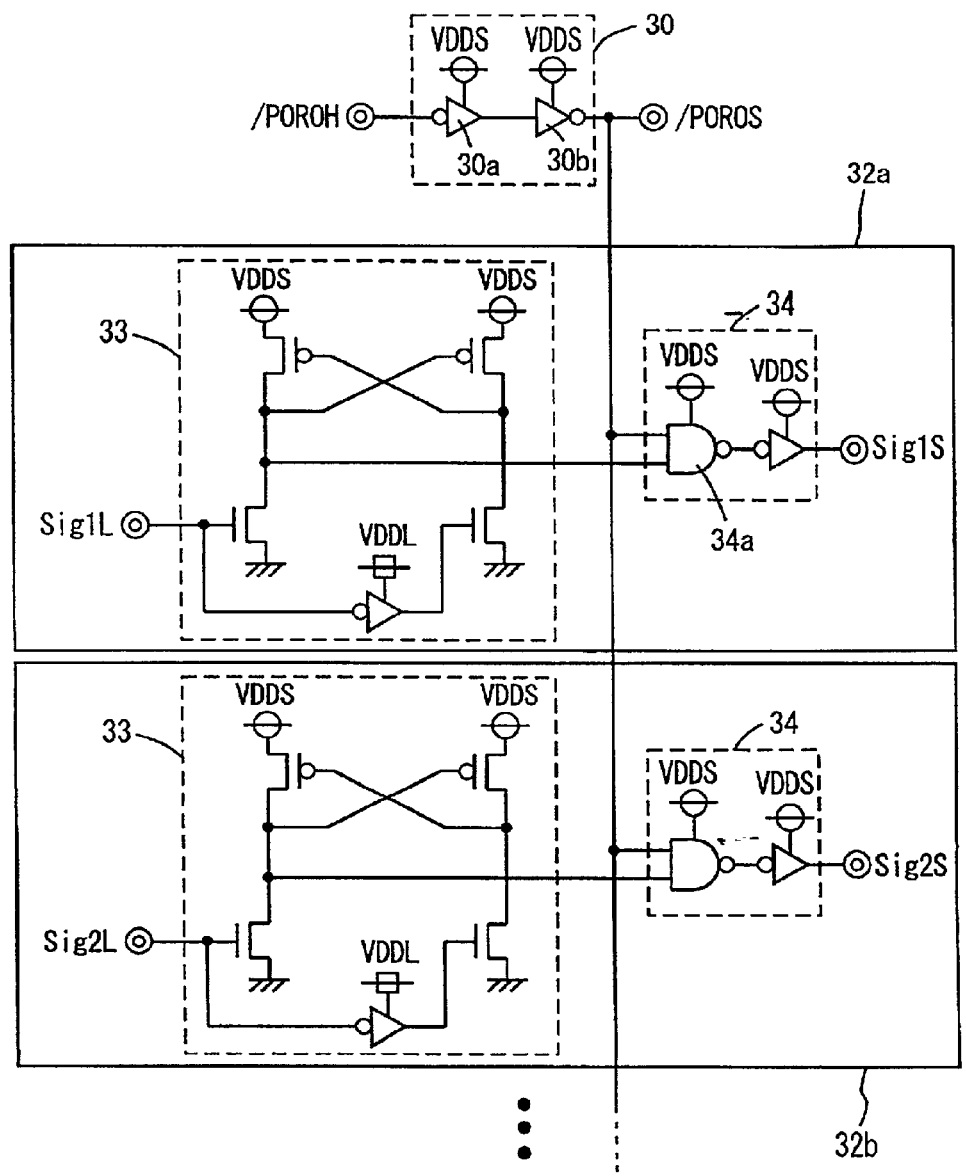
FIG. 11 is a diagram showing a structure of Modification 1 of the second embodiment of the present invention.

FIG. 11 is a diagram showing a structure of Modification 1 of the second embodiment according to the present invention. In FIG. 11, internal drive circuits 32a and 32b convert an input signal SigL (Sig1L, Sig2L) whose amplitude is the logic power supply voltage VDDL level into a signal SigS (Sig1S, Sig2S) whose amplitude is the array power supply voltage VDDS level. Each of these internal drive circuits 32a and 32b includes a level conversion circuit 33 for converting the input signal SigL (Sig1L, Sig2L) having the amplitude of the power supply voltage VDDL level into a signal having the amplitude of the array power supply voltage VDDS, and a buffer circuit 34 for buffering the output signal of the level conversion circuit 33 to generate the output signal SigS (Sig1S, Sig2S).

For the internal drive circuits 32a, 32b . . . , a converting voltage application detection circuit 30 is provided commonly for converting the level of a main power-on detection signal /POROH of the amplitude VDDH to generate a converted voltage application detection signal /POROS of the amplitude VDDS. The converted voltage application detection signal /POROS is applied to an NAND circuit 34a at the first stage of the buffer circuit 34 of each of the internal drive circuits 32a, 32b . . . The converting voltage application detection circuit 30 includes two-stage cascaded inverters 30a and 30b each receiving the array power supply voltage VDDS as an operation power supply voltage. Since the voltage level of the array power supply voltage VDDS is lower than that of the DRAM power supply voltage VDDH, the inverters 30a and 30b receiving the array power supply voltage VDDS as an operation power supply voltage can convert the level of main power-on detection signal /POROH of the amplitude VDDH to generate the converted voltage application detection signal /POROS.

Also in the structure as illustrated in FIG. 11, the array power supply voltage VDDS is generated by down-converting the DRAM power supply voltage VDDH. Therefore, even when the logic power supply voltage VDDL is applied after the DRAM power supply voltage VDDH is applied, while the converted voltage application detection signal /POROS is at the "L" level, the NAND circuit 34a in the buffer circuit 34 outputs a "H" level signal without causing through current even if a voltage of the internal node of the corresponding level conversion circuit 33 goes up to an intermediate voltage level.

When the main power-on detection signal /POROH attains the "H" level, the converted voltage application detection signal /POROS attains the "H" level, so that the internal drive circuits 32a, 32b . . . each generate the output signal SigS (Sig1S, Sig2S) according to the input signal SigL (Sig1L, Sig2L).

As illustrated in FIG. 11, also in the circuit for converting a signal of the amplitude VDDL into a signal of the amplitude VDDS, making use of the converted voltage application detection signal /POROS of the amplitude VDDS enables reduction of current consumption at the time of power application irrespective of power supply voltage application sequences, as well as enabling reduction in an area occupied by the level conversion circuit 33 of the internal drive circuit 32 (32a, 32b).

[Modification 2]

Figure 12:
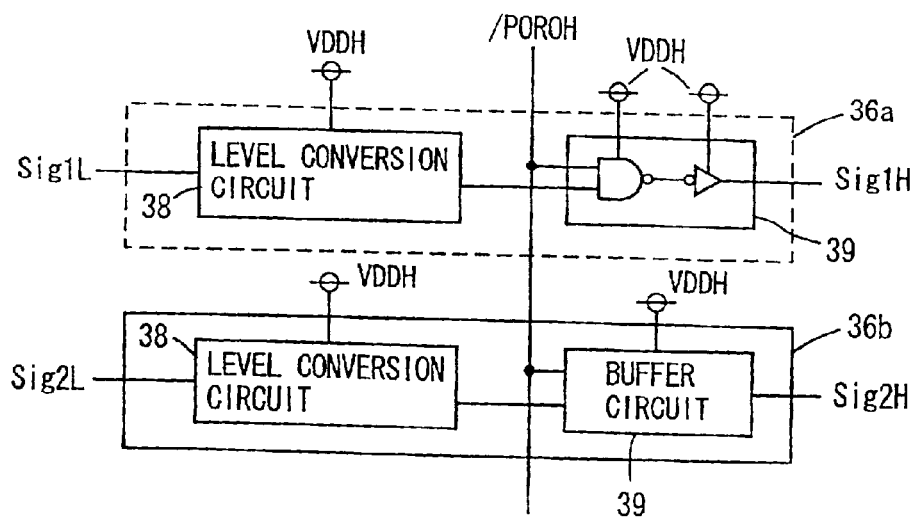
FIG. 12 is a diagram showing a structure of Modification 2 of the second embodiment of the present invention.

FIG. 12 is a diagram schematically showing a structure of Modification 2 of the second embodiment according to the present invention. In FIG. 12, internal drive circuits 36a, 36b . . . each convert an input signal SigL (Sig1L, Sig2L) having an amplitude of the logic power supply voltage VDDL into a signal SigH (Sig1H, Sig2H) having an amplitude of the DRAM power supply voltage VDDH. Each of these internal drive circuits 36a, 36b . . . . includes a level conversion circuit 38 for converting the input signal SigL of the amplitude VDDL into a signal of the amplitude VDDH, and a buffer circuit 39 for generating the output signal SigH of the amplitude VDDH according to the output signal of the level conversion circuit 38 and the main power-on detection signal /POROH. The buffer circuit 39 includes an NAND circuit at the input first stage and an inverter receiving the output signal of the NAND circuit. To the first stage NAND circuit 39, the main power-on detection signal /POROH is applied.

The main power-on detection signal /POROH has the amplitude VDDH. Therefore, also in such a circuit for converting a signal of the amplitude VDDL into a signal of the amplitude VDDH, application of the main power-on detection signal /POROH of the amplitude VDDH to the buffer circuit as an input signal enables reduction of current consumption at the time of power application irrespective of power application sequence, because through current at the buffer circuit is suppressed.

Figure 13:
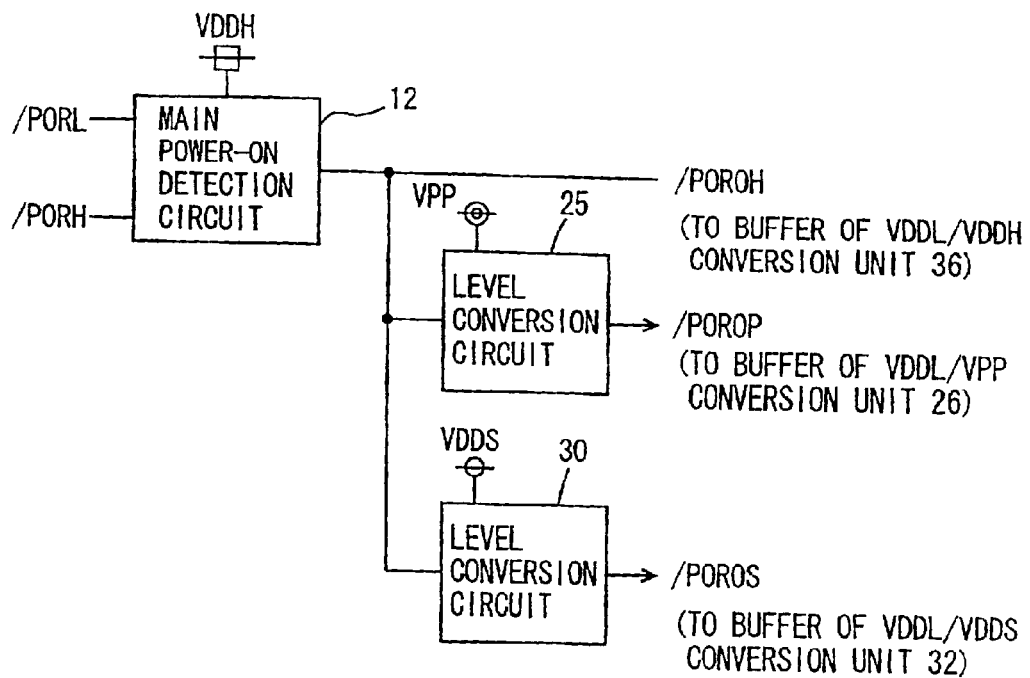
FIG. 13 is a diagram schematically showing a structure of modification 3 of the second embodiment of the present invention.

The structures shown in FIGS. 9, 11 and 12 may be used in combination. More specifically, as shown in FIG. 13, from the main power-on detection signal /POROH of the amplitude VDDH from the main power-on detection circuit 12, the converted voltage application detection signal /POROP of the amplitude VPP and the converted voltage application detection signal /POROS of the amplitude VDDS are generated by the level conversion circuits 25 and 30, respectively.

The main power-on detection signal /POROH is applied to the buffer circuit 39 included in the internal drive circuit (VDDL/VDDH conversion unit) 36 for converting a signal of the amplitude VDDL into a signal of the VDDH as illustrated in FIG. 12. The converted voltage application detection signal /POROP from the level conversion circuit 25 is applied to the buffer circuit 28 included in the VDDL/VPP conversion unit (internal drive circuit) 26 for converting a signal of the amplitude VDDL into a signal of the amplitude VPP as illustrated in FIG. 9. The converted voltage application detection signal /POROS from the level conversion circuit 30 is applied to the buffer circuit 34 of the VDDL/VDDS conversion unit (internal drive circuit) 32 for converting a signal of the amplitude VDDL into a signal of the amplitude VDDS as illustrated in FIG. 11.

Irrespective of the power supply voltage VDDH and VDDL application sequence, through currents can be reliably prevented in the level conversion circuits for converting a signal of the amplitude VDDL into a signal having the amplitude of the DRAM power supply voltage VDDH and into a signal having an amplitude of an internal voltage generated from the DRAM power supply voltage VDDH.

As described in the foregoing, according to the second embodiment of the present invention, a power-on detection signal having the same amplitude as that of a signal whose level has been converted at a level converting circuit and is applied to a buffering circuit as an input signal. Therefore, a through current at the time of power application can be reliably suppressed irrespective of power application sequence, thereby reducing current consumption accordingly. In addition, the level conversion circuit requires none of components for resetting (initializing) a voltage level of an internal node at the time of power application, which leads to reduction in an area penalty by such a component.

[Third Embodiment]

Figure 14:
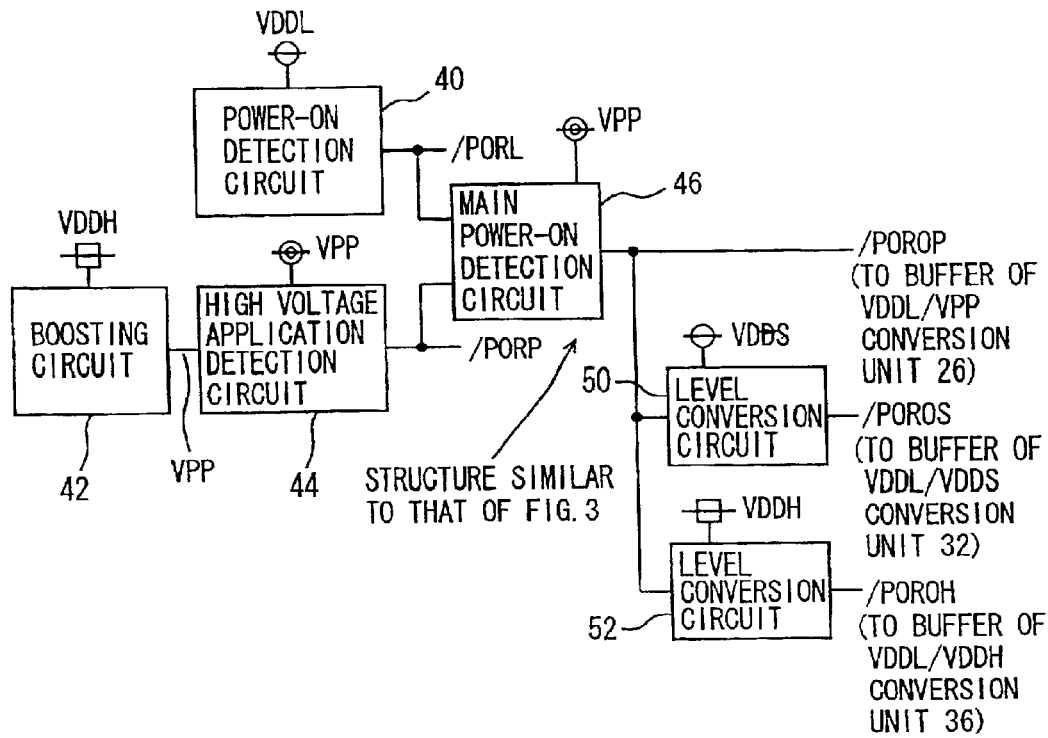
FIG. 14 is a diagram schematically showing a structure of a power-on detection unit according to a third embodiment of the present invention.

FIG. 14 is a diagram schematically showing a structure of a power-on detection signal generation unit according to the third embodiment of the present invention. In FIG. 14, the power-on detection signal generation unit includes: a power-on detection circuit 40 for detecting application of the logic power supply voltage VDDL to generate a logic power-on detection signal /PORL; a boosting circuit 42 for generating the boosted voltage VPP from the DRAM power supply voltage VDDH; a high voltage application detection circuit 44 for generating a high voltage application detection signal /PORP according to the voltage level of the boosted voltage VIPP from the boosting circuit 42; and a main power-on detection circuit 46 for generating a main power-on detection signal /POROP which is rendered inactive when both of the logic power-on detection signal /PORL and the high voltage application detection signal /PORP are inactivated.

The main power-on detection signal /POROP from the main power-on detection circuit 46 has the amplitude VPP. In the structure of the main power-on detection circuit 46, the boosted voltage VPP is used in place of the DRAM power supply voltage VDDH used in the structure of the previously described main power-on detection circuit 12 shown in FIG. 3. In addition, the power-on detection signal /PORP is used in place of the detection signal /PORH. According to such configuration, in place of the main power-on detection signal /POROH of the amplitude VDDH, the main power-on detection signal /POROP having the amplitude of the boosted voltage VPP level can be generated.

The power-on detection signal generation unit further includes a level conversion circuit 50 for converting the main power-on detection signal /POROP into a converted voltage detection signal /POROS having an amplitude of the array power supply voltage VDDS level, and a level conversion circuit 52 for converting the main power-on detection signal /POROP into a signal /PORH having an amplitude of the DRAM power supply voltage VDDH. The main power-on detection signal /POROP is applied to the buffer circuit 28 of the VDDL/VPP conversion circuit 26 for converting a signal of the amplitude VDDL into a signal of the amplitude VPP (see FIG. 9).

The converted voltage application detection signal /POROS from the level conversion circuit 50 is applied to the buffer circuit 34 of the VDDL/VDDS conversion circuit 32 for converting a signal of the amplitude VDDL into a signal of the amplitude VDDS (see FIG. 11). The converted voltage application detection signal /POROH from the level conversion circuit 52 is applied to the buffer circuit 39 of the VDDL/VDDH conversion circuit 36 for converting a signal of the amplitude VDDL into a signal of the amplitude VDDH (see FIG. 12).

Also in the structure illustrated in FIG. 14, the boosted voltage VPP is generated from the DRAM power supply voltage VDDH and when the boosted voltage VPP is stabilized, the DRAM power supply voltage VDDH is also stabilized. Accordingly, the main power-on detection signal /POROP from the main power-on detection circuit 46 attains the inactive state when the logic power supply voltage VDDL is applied and stabilized, and when the DRAM power supply voltage VDDH is then applied and stabilized and the boosted voltage VPP is responsibly stabilized. It is therefore possible to maintain the internal level conversion circuit at the reset state until the internal voltages (power supply voltages) are stabilized, thereby enabling a through current at the time of power application to be suppressed.

The power-on detection signal /PORL is used for initializing (reset) an internal node of a circuit using the power supply voltage VDDL (not performing level conversion). The high voltage application detection signal /PORP is used for resetting an internal node of a circuit which consumes the boosted voltage or high voltage (not performing voltage level conversion).

[Modification]

Figure 15:
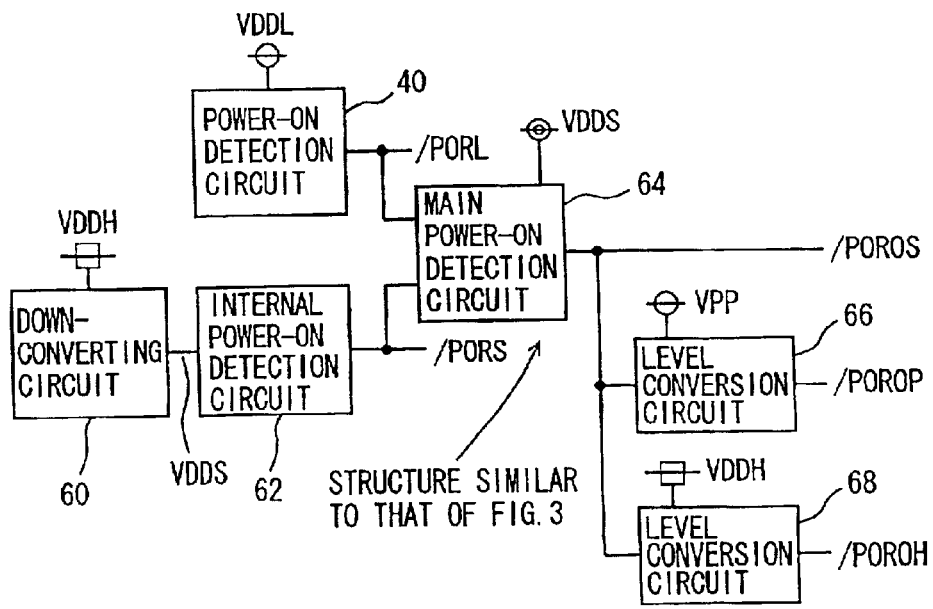
FIG. 15 is a diagram schematically showing a structure of Modification 1 of the third embodiment of the present invention.
Figure 16:
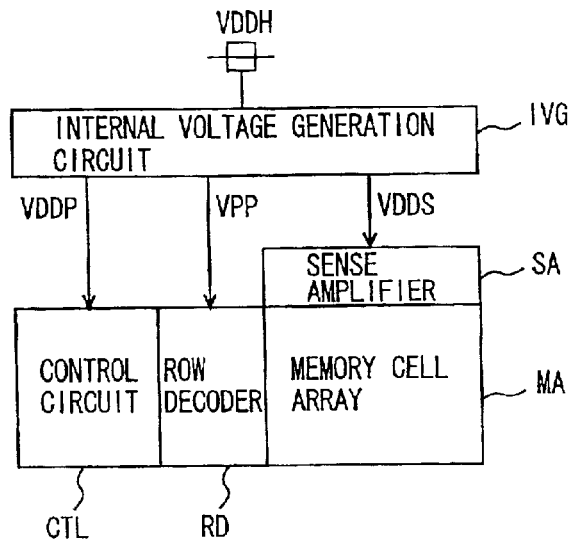
FIG. 16 is a diagram schematically showing a structure of a conventional semiconductor storage device.
Figure 17:
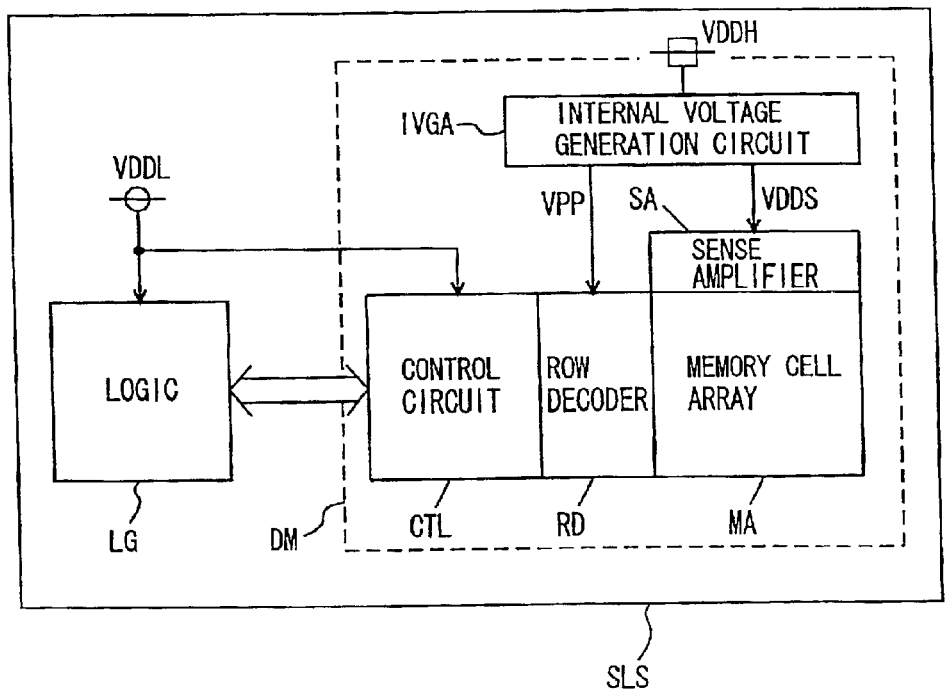
FIG. 17 is a diagram showing one example of a structure of a semiconductor integrated circuit device to which the present invention is applied.
Figure 18:
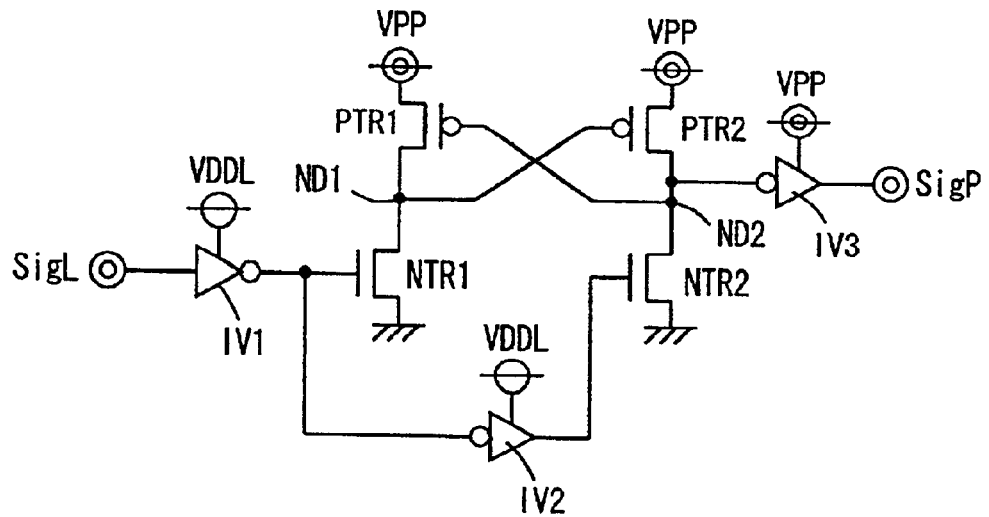
FIG. 18 is a diagram showing a structure of a level conversion circuit in the semiconductor integrated circuit device illustrated in FIG. 17.
Figure 19:
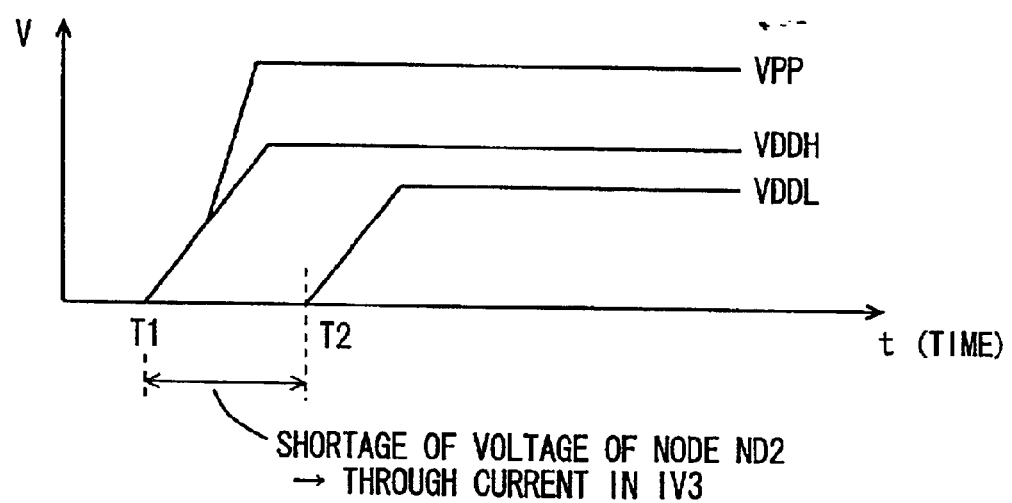
FIG. 19 is a diagram sowing one example of a voltage generation sequence of internal voltage generation circuitry illustrated in FIG. 17.

FIG. 15 is a diagram schematically showing a structure of a modification of the third embodiment according to the present invention. In FIG. 15, the power-on detection signal generation unit includes a down-converting circuit (internal power supply circuit) 60 for down-converting the DRAM power supply voltage VDDH to generate the array power supply voltage VDDS, an internal power-on detection circuit 62 for detecting the array power supply voltage VDDS from the down-converting circuit 60 attaining the stable state, a power-on detection circuit 40 for detecting application of the logic power supply voltage VDDL, and a main power-on detection circuit 64 for generating a main power-on detection signal /POROS according to a power-on detection signal /PORL from the power-on detection circuit 40 and an internal power-on detection signal /PORS from the internal power-on detection circuit 62. The main power-on detection circuit 64 has the same structure as that shown in FIG. 3, and generates the main power-on detection signal /POROS of the amplitude VDDS. In the main power-on detection circuit 64, the array power supply voltage VDDS is used in place of the power supply voltage VDDH used in the structure shown in FIG. 3. In addition, the power-on detection signal /PORS is used in place of the power-on detection signal /PORH.

The down-converting circuit 60 is structured by a circuit for supplying current from a power supply node to an output node (array power supply line) according to a difference between a reference voltage and the array power supply voltage VDDS, and down-converts the externally applied DRAM power supply voltage VDDH to generate the array power supply voltage VDDS.

The power-on detection signal generation unit further includes a level conversion circuit 66 for converting the main power-on detection signal /POROS of the amplitude VDDS from the main power-on detection circuit 64 into the converted voltage application detection signal /POROP of the amplitude VPP, and a level conversion circuit 68 for converting the main power-on detection signal /POROS of the amplitude VDDS into the power-on detection signal /POROH of the amplitude VDDH. Since the array power supply voltage VDDS is lower than the boosted voltage VPP and the DRAM power supply voltage VDDH, the structure of these level conversion circuits 66 and 68 is the same as that of the previously described level conversion circuit 25 shown in FIG. 9.

The array power supply voltage VDDS is generated according to the DRAM power supply voltage VDDH. When the array power supply voltage VDDS is stabilized, the DRAM power supply voltage VDDH has been stabilized as well. It is accordingly possible to detect the array power supply voltage, the DRAM power supply voltage VDDH and the logic power supply voltage VDDL being stable by generating the main power-on detection signal /POROS from the main power-on detection circuit 64 according to the application detection signals /PORL and /PORS. When the DRAM power supply voltage VDDH is stable, the boosted voltage VPP is also stable. It is therefore possible to prevent a through current at each level conversion circuit at the time of power-on and accordingly reduce current consumption by detecting timing of stabilization of the array power supply voltage VDDS and the logic power supply voltage VDDL through the main power-on detection signal /POROS and by generating the application detection signal /POROP to the VDDL/VPP conversion unit and the application detection signal /POROH to the VDDL/VDDH conversion unit according to the main power-on detection signal /POROS.

In the structures shown in FIGS. 14 and 15, an application detection signal for an internal voltage stabilized at the latest timing may be used as a main power-on detection signal. In a case, for example, where the boosted voltage VPP is stabilized at a timing slower than the array power supply voltage VDDS, the power-on detection signal /POROP for the boosted voltage VPP may be used as a main power-on detection signal. When the boosted voltage VPP is settled at timing earlier than the array power supply voltage VDDS, the main power-on detection signal /POROS using the array power supply voltage VDDS may be used. As a result, the internal reset state can be released or quitted upon stabilization of all the internal voltages.

[Other Application Examples]

The foregoing description has been made of a system LSI in which a logic and a DRAM are integrated together. The present invention, however, is also applicable, for example, to a structure where a system LSI contains a logic and a flash EEPROM (electrically erasable and programmable read only memory) formed on the same semiconductor chip and a logic power supply voltage and a memory power supply voltage are supplied separately, and the signal level conversion is required in the flash EEPROM. In other words, the present invention is in general applicable to a semiconductor integrated circuit device using a plurality of power supply voltages to internally generate a plurality of kinds of internal voltages.

As described in the foregoing, according to the present invention, with a plurality of power supply systems provided, a main power-on detection signal for resetting an internal node is maintained at the active state until all the internal power supply voltages are stabilized, and therefore, a voltage level of the internal node is prevented from becoming unstable to prevent a through current accordingly generated internally, thereby enabling reduction of current consumption at the time of power application.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
a first power-on detection circuit responsive to a first power supply voltage for detecting power-on of said first power supply voltage to activate a first power-on detection signal according to a result of detection;
a second power-on detection circuit responsive to a second power supply voltage for detecting power-on of said second power supply voltage independently of a voltage level of said first power supply voltage, to activate a second power-on detection signal according to a result of detection, said first power-on detection circuit performing detection of the power-on independently of a voltage level of the second power supply voltage;
a main power-on detection circuit coupled to the first and second power-on detection circuits for generating a main power-on detection signal rendered active from activation of a first activated power-on detection signal of the first and second power-on detection signals until inactivation of a second activated power-on detection signal of the first and second power-on detection signals.

2. The semiconductor integrated circuit device according to claim 1, wherein said main power-on detection circuit comprises
a first reset element responsive to activation of said first power-on detection signal for resetting a first node to a first voltage level,
a second reset element responsive to activation of said second power-on detection signal for resetting said first node to said first voltage level, and
a circuit coupled to said first node and receiving said first power supply voltage as an operation power supply voltage for inactivating said main power-on detection signal and setting said first node to a second voltage level when both of said first and second power-on detection signals are inactivated.

3. The semiconductor integrated circuit device according to claim 1, further comprising a converting voltage application detection circuit receiving a voltage different in voltage level from said second power supply voltage as an operation power supply voltage for converting a voltage level of said main power-on detection signal to generate a converted voltage application detection signal.

4. The semiconductor integrated circuit device according to claim 1, further comprising:
an internal voltage generation circuit for generating an internal voltage from said first power supply voltage, said internal voltage differing in voltage level from said second power supply voltage; and
an internal circuit reset when said main power-on detection signal is activated, and activated, when said main power-on detection signal is inactivated, for converting a signal having an amplitude of said second power supply voltage level into a signal having an amplitude of the internal voltage level.

5. The semiconductor integrated circuit device according to claim 4, wherein said internal voltage is a boosted voltage higher in voltage level than said first supply voltage.

6. The semiconductor integrated circuit device according to claim 4, wherein said internal voltage is a down-converted voltage lower in voltage level than said first power supply voltage.

7. The semiconductor integrated circuit device according to claim 1, wherein the first and second power supply voltages are applied to a storage device and said second power supply voltage is applied to a logic circuit, the storage device and the logic circuit being integrated on a common semiconductor chip.

8. The semiconductor integrated circuit device according to claim 1, wherein said main power-on detection signal has an amplitude of the first power supply voltage level, and said semiconductor integrated circuit device further comprises:

an internal voltage generation circuit for generating, from said first power supply voltage, an internal voltage different in voltage level from said second power supply voltage;

an internal signal generation circuit for generating an internal signal having an amplitude of the internal voltage level from a signal having an amplitude of the second power supply voltage level, said internal signal generation circuit including a buffer circuit receiving said internal voltage as an operation power supply voltage for generating said internal signal; and a converting voltage application detection circuit for converting said main power-on detection signal into a convened voltage application detection signal having an amplitude of said internal voltage level and applying the converted voltage application detection signal to said buffer circuit, said buffer circuit being reset when said converted voltage application detection signal is activated.

9. The semiconductor integrated circuit device according to claim 8, wherein said internal voltage generation circuit includes a boosting circuit for boosting said first power supply voltage to generate said internal voltage.

10. The semiconductor integrated circuit device according to claim 8, wherein said internal voltage generation circuit includes an internal down-converting circuit for down-converting said first power supply voltage to generate an internal power supply voltage as said internal voltage.

11. A semiconductor integrated circuit device comprising;

an internal voltage generation circuit receiving a first power supply voltage and generating, from said first power supply voltage, an internal voltage different in voltage level from said first power supply voltage;

an internal voltage application detection circuit for activating an internal voltage power-up detection signal according to a voltage level of said internal voltage;

a power-on detection circuit for detecting power-on of a second power supply voltage independently of a voltage level of said internal voltage, to activate a power-on detection signal according to a result of detection, said internal voltage application detection circuit performing detection of the voltage level of the internal voltage independently of a voltage level of the second power supply voltage; and a main power-on detection circuit responsive to said internal voltage power-up detection signal and said power-on detection signal for generating a main power-on detection signal rendered active from activation of a first activated detection signal of the internal voltage power-up detection signal and the power-on detection signal until inactivation of second activated detection signal of the internal voltage power-up detection signal and the power-on detection signal.

12. The semiconductor integrated circuit device according to claim 11, further comprising an internal signal generation circuit inactivated when the main power-on detection signal from said main power-on detection circuit is activated, and activated, when said main power-on detection signal is inactivated, for generating an internal signal having an amplitude of said internal voltage level from a signal having an amplitude of said second power supply voltage level.

13. The semiconductor integrated circuit device according to claim 12, wherein said internal signal generation circuit includes a buffer circuit receiving said internal voltage as an operation power supply voltage and generating said internal signal, said buffer circuit being reset when said main power-on detection signal is activated and buffering a level converted signal to generate said internal signal when said main power-on detection signal is inactivated.

14. The semiconductor integrated circuit device according to claim 11, wherein said main power-on detection signal is a signal having an amplitude of said internal voltage level, and said integrated circuit device further comprises a level conversion circuit for converting a voltage level of said main power-on detection signal to generate a converted voltage application detection signal, and an internal signal generation circuit inactivated when said converted voltage application detection signal is activated and activated, when said converted voltage application detection signal is inactivated, for converting a level of a signal having an amplitude of said second power supply voltage level to generate an internal signal having an amplitude equal to an amplitude of said converted voltage application detection signal.

15. The semiconductor integrated circuit device according to claim 14, further comprising an internal power supply circuit for generating, from said first power supply voltage, an internal power supply voltage different in voltage level from said internal voltage, wherein said internal signal generation circuit includes a buffer circuit receiving said internal power supply voltage as an operation power supply voltage and buffering a level converted signal for outputting, said buffer circuit having an internal node being reset when said converted voltage application detection signal is activated.

16. The semiconductor integrated circuit device according to claim 11, wherein said internal voltage generation circuit includes a boosting circuit for boosting said first power supply voltage.

17. The semiconductor integrated circuit device according to claim 11, wherein said internal voltage generation circuit includes a down-converting circuit for down-converting said first power supply voltage to generate said first internal voltage.

18. The semiconductor integrated circuit device according to claim 11, wherein the first and second power supply voltages are applied to a storage device and said second power supply voltage is applied to a logic circuit, said storage device and said logic circuit being integrated on a common semiconductor chip.

19. A semiconductor device receiving a plurality of power supply voltages for operation, comprising:

a plurality of power-up detection circuits provided for the respective power supply voltages and detecting power-up of the respective power supply voltages to generate power-up detection signals corresponding to the respective power supply voltages, each power-up detection circuit detecting a voltage level of a corresponding power supply voltage independently of a voltage level of the power supply voltage other than the corresponding power supply voltage; and a main power-on detection circuit coupled to receive the respective power supply voltages for activating a main power-on detection signal from activation of a first activated power-up detection signal in the power-up detection signals until inactivation of a last activated power-up detection signal in the power-up detection signals, to hold an internal circuit in a reset state.

20. A semiconductor device comprising:

internal voltage generation circuitry coupled to receive at least one power supply voltage and generating, from said at least one power supply voltage, a plurality of internal voltages differing in voltage level from each other;

internal voltage power-up detection circuitry provided for at least one of the plurality of internal voltages and detecting power-up of the at least one internal voltage in accordance with a voltage level of said at least one internal voltage for generating at least one internal voltage power-up detection signal for said at least one internal voltage;

power-on detection circuitry provided for at least one power source voltage other than said at least one power supply voltage, for detecting power-on of said at least one power source voltage in accordance with a voltage level of said at least one power source voltage independently of the voltage level of said at least one internal voltage, to generate at least one power-on detection signal for the respective at least one power source voltage, said internal voltage power-up detection circuitry performing detection independently of the voltage level of the at least one power source voltage; and main power-on detection circuitry responsive to said at least one internal voltage power-up detection signal and said at least one power-on detection signal for generating a main power-on detection signal made active from activation of a first activated detection signal in said at least one power-up detection signal and said at least one power-on detection signal until inactivation of a last activated detection signal in said at least one power-up detection signal and said at least one power-on detection signal, to hold an internal circuit in a reset state.

21. The semiconductor integrated device according to claim 1, wherein the activation of the detection signal indicates instability of a corresponding power supply voltage, and the inactivation of the detection signal indicates stability of the corresponding power supply voltage.

22. The semiconductor integrated circuit device according to claim 11, wherein activation of the detection signal indicates instability of a corresponding power supply voltage, and inactivation of the detection signal indicates stability of the corresponding power supply voltage.

23. The semiconductor device according to claim 19, wherein the activation of the detection signal indicates instability of a corresponding power supply voltage, and the inactivation of the detection signal indicates stability of the corresponding power supply voltage.

24. The semiconductor device according to claim 20, wherein the activation of the detection signal indicates instability of a corresponding voltage and the inactivation of the detection signal indicates stability of the corresponding voltage.

* * * * *